United States Patent [19]
Tonegawa et al.

[11] Patent Number: 5,532,658
[45] Date of Patent: Jul. 2, 1996

[54] MOUNTING STRUCTURE FOR ELECTRONIC COMPONENT

[75] Inventors: Ken Tonegawa; Harufumi Mandai; Teruhisa Tsuru; Mitsuhide Katou; Koji Furutani, all of Kyoto, Japan

[73] Assignee: Murata Manufacturing Co., Ltd., Japan

[21] Appl. No.: 362,805

[22] Filed: Dec. 22, 1994

[30] Foreign Application Priority Data

Dec. 22, 1993 [JP] Japan .................................. 5-324311
Dec. 28, 1993 [JP] Japan .................................. 5-336404
Dec. 28, 1993 [JP] Japan .................................. 5-336406

[51] Int. Cl.$^6$ ............................. H01P 5/00; H01L 23/48
[52] U.S. Cl. ...................... 333/246; 257/693; 257/697; 257/728; 333/24 C
[58] Field of Search ................................ 333/24 C, 246, 333/247; 257/664, 691–693, 696, 697, 728

[56] References Cited

U.S. PATENT DOCUMENTS 4,600,907  7/1986  Grellman et al. ...................... 333/246
4,716,389  12/1987  Gawronski et al. ................ 333/246 X
4,816,789  3/1989  Mars ...................................... 333/246
5,138,436  8/1992  Koepf .................................... 257/728

*Primary Examiner*—Paul Gensler
*Attorney, Agent, or Firm*—Ostrolenk, Faber, Gerb & Soffen

[57] ABSTRACT

An electronic component which is employed in the frequency range in the microwave band or above is mounted on a circuit board. The circuit board comprises two linear transmission line members, a ground electrode, and an electric insulating substrate provided with the transmission line members and the ground electrode on its major surface. The electronic component comprises external electrodes which are formed on its side surfaces. Holding patches which are formed on the lower surface of the electronic component are bonded to the ground electrode by solder members, thereby fixing the electronic component to the circuit board. At this time, small clearances are defined between the electronic component and the circuit board through the solder members, whereby the external electrodes are electromagnetically coupled with the transmission line members and the ground electrode through the clearances respectively. Thus, it is possible to obtain a mounting structure for an electronic component, which can suppress development of unnecessary inductance components.

28 Claims, 23 Drawing Sheets

5,532,658

MOUNTING STRUCTURE FOR ELECTRONIC COMPONENT

BACKGROUND OF THE INVENTION

Field of the Invention

The present invention relates to a structure for mounting an electronic component on a circuit board, and more particularly, it relates to a mounting structure for an electronic component which is employed in the frequency range in the microwave band or above.

Description of the Background Art

FIG. 25 shows a mounting structure for a chip electronic component 1, which is of interest to the present invention. The electronic component 1 comprises external electrodes 2 and 3 which are formed on its side surfaces. On the other hand, a circuit board 4 comprises an electric insulating substrate 5, which is provided thereon with transmission line members 6 and 7 comprising conductive patterns.

The electronic component 1 is placed on the circuit board 4, and the external electrodes 2 and 3 are bonded to the transmission line members 6 and 7 by solder members 8 and 9. When the electronic component 1 is thus mounted on the circuit board 4, the solder members 8 and 9 attain mechanical bonding between the electronic component 1 and the circuit board 4, and electric connection between the external electrodes 2 and 3 and the transmission line members 6 and 7 respectively.

In the mounting structure for the electronic component 1 shown in FIG. 25, however, the external electrodes 2 and 3 are connected with the transmission line members 6 and 7 through the solder members 8 and 9 respectively, and hence relatively large inductance components are generated in the transmission line by the solder members 8 and 9 in a high frequency band. Such inductance components exert relatively large influences on the electric characteristics of the circuit including the electronic component 1, and it is necessary to take some countermeasure against this. The electric characteristics are further remarkably changed particularly in the microwave band of 5 GHz or above.

SUMMARY OF THE INVENTION

An object of the present invention is to provide a mounting structure for an electronic component, which can suppress development of the aforementioned undesired inductance components.

The present invention is directed to a structure for mounting an electronic component, which is employed in the frequency range in the microwave band or above, on a circuit board. The circuit board comprises a transmission line member, a ground electrode which is electrically insulated from the transmission line member, and an electric insulating substrate having a major surface and holding the transmission line member and the ground electrode. On the other hand, the electronic component comprises a plurality of external terminals. According to the present invention, the electronic component is fixed to the circuit board so that the external terminals are electromagnetically coupled with the transmission line member and the ground electrode respectively, in order to attain the aforementioned object.

When the external terminals of the electronic component are electromagnetically coupled with the transmission line member and the ground electrode respectively, a high-pass filter is formed between the transmission line member and the electronic component an inductance-capacitance (LC) circuit. The transmission line member of the circuit board and the corresponding external terminal of the electronic component are electromagnetically coupled with each other through the capacitance, to transmit a signal in the frequency range exceeding the cut-off frequency of the high-pass filter.

According to the present invention, therefore, the external terminals of the electronic component are electromagnetically coupled with the transmission line member and the ground electrode of the circuit board through capacitance components respectively, whereby no connecting member such as solder is required. Consequently, the transmission line is prevented from development of an unnecessary inductance component, whereby the original electric characteristics of the electronic component which is mounted on the circuit board are not substantially deteriorated.

The aforementioned electromagnetic coupling is preferably attained through small clearances, resin, or parts of the substrate, defined between the external terminals of the electronic component and the transmission line member and the ground electrode of the circuit board. In this case, it is possible to adjust the lower limit of the transmission frequency as well as to readily attain impedance matching between the electronic component and peripheral circuits by changing the distances between the external terminals and the transmission line member and the ground electrode, or the dielectric constant of the resin or the substrate.

The foregoing and other objects, features, aspects and advantages of the present invention will become more apparent from the following detailed description of embodiments of the present invention when taken in conjunction with the accompanying drawings.

DESCRIPTION OF THE PREFERRED EMBODIMENTS

Figure 1:
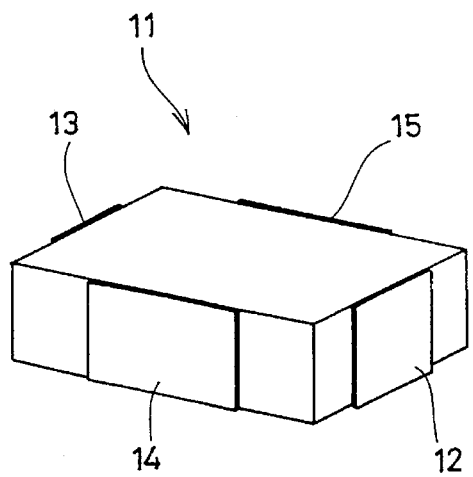
FIG. 1 is a perspective view showing an exemplary electronic component to which the present invention is applied.
Figure 2:
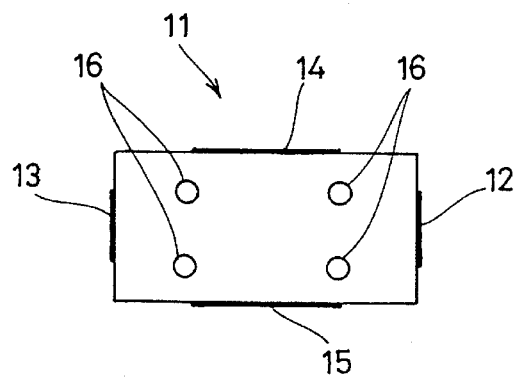
FIG. 2 is a bottom plan view of the electronic component shown in FIG. 1.

FIGS. 1 and 2 show a chip electronic component 11 which is in the form of a rectangular parallelepiped. This electronic component 11 has opposite upper and lower surfaces and four side surfaces connecting the upper and lower surfaces with each other. The electronic component 11 comprises input/output-side external electrodes 12 and 13 and ground-side external electrodes 14 and 15 as external terminals. The input/output-side external electrodes 12 and 13 are formed on the shorter side surfaces of the electronic component 11 to be opposed to each other, while the ground-side external electrodes 14 and 15 are formed on the longer side surfaces of the electronic component 11 to be opposed to each other. Further, a plurality of holding patches 16 are formed on the bottom surface of the electronic component 11 by metal films.

Figure 3:
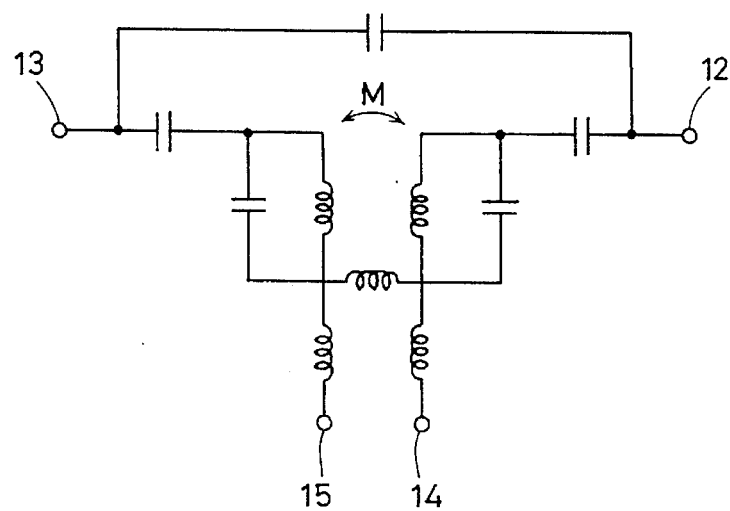
FIG. 3 is a circuit diagram showing an equivalent circuit provided by the electronic component shown in FIG. 1.

The aforementioned electronic component 11 is utilized in the frequency range in the microwave band or above. The electronic component 11 forms a band-pass filter including inductance-capacitance (LC) shown in FIG. 3, for example. Referring to FIG. 3, elements corresponding to the external electrodes 12 to 15 shown in FIGS. 1 and 2 are denoted by the same reference numerals. While detailed description is omitted, the electronic component 11 comprises a multilayer ceramic structure and conductive films which are interposed between ceramic layers, in order to provide the filter shown in FIG. 3.

The electronic component to which the present invention is applied is not restricted to the aforementioned component forming a band-pass filter, but may have any function so far as the component is utilized in the frequency range in the microwave band or above.

FIGS. 4 and 5, 8 and 9, 10 and 11, 12 and 13, and 14 and 15 illustrate some exemplary mounting structures for the electronic component 11 shown in FIGS. 1 and 2 respectively.

Figure 4:
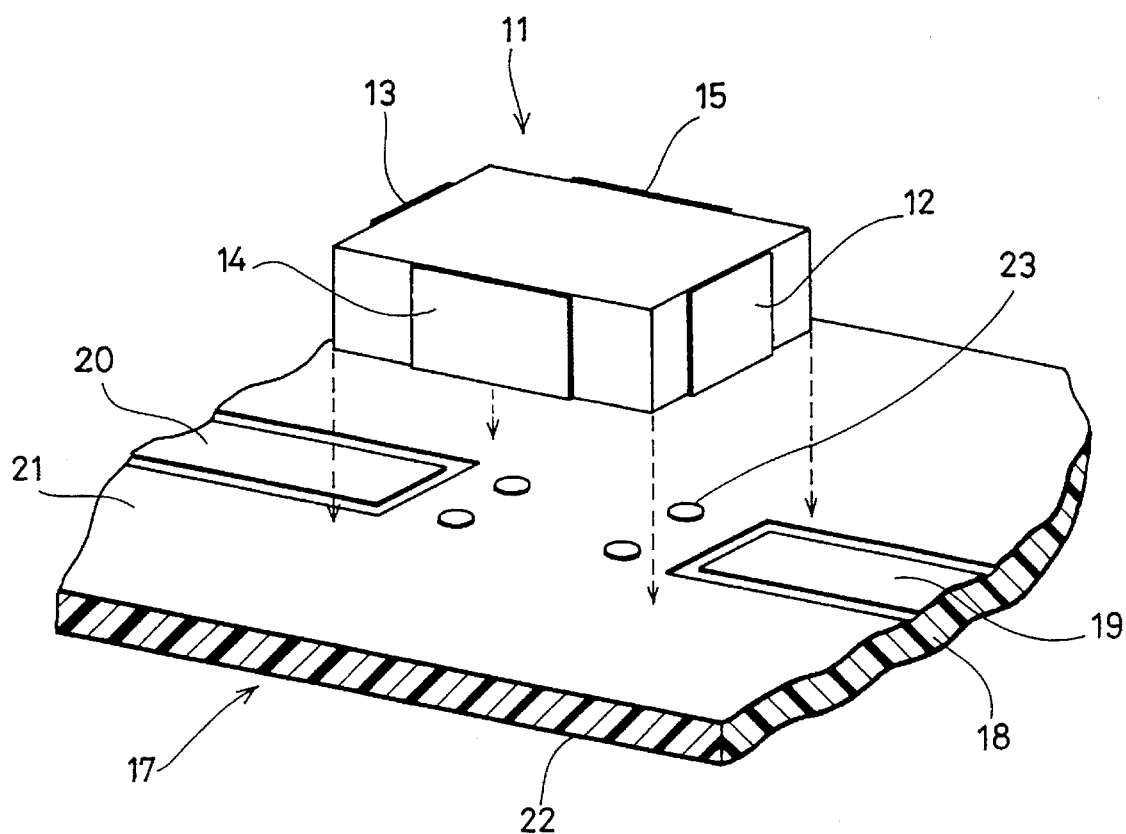
FIG. 4 is a perspective view showing a mounting structure for an electronic component according to a first embodiment of the present invention.
Figure 5:
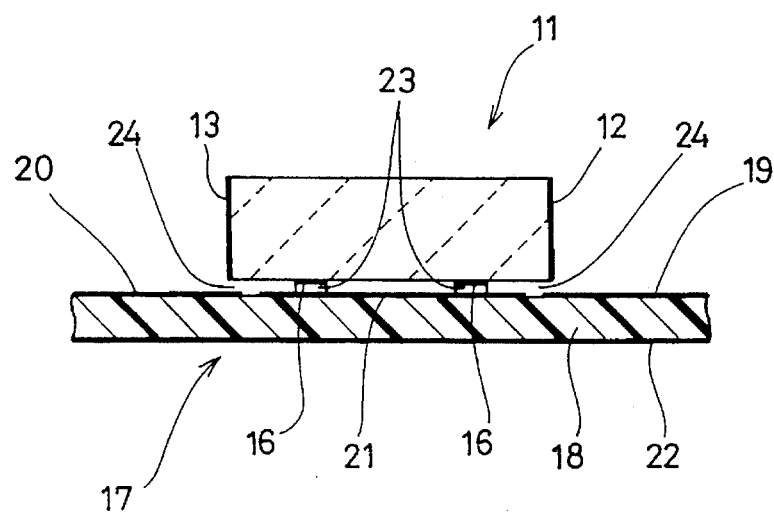
FIG. 5 is a sectional view of the mounting structure shown in FIG. 4.

Referring to FIGS. 4 and 5, a circuit board 17 comprises an electric insulating substrate 18 which is made of ceramic or resin, for example. The substrate 18 is provided on its upper major surface with two linear transmission line members 19 and 20 which are opposed to each other on a straight line, and a first ground electrode 21 which is electrically insulated from the transmission line members 19 and 20 through prescribed gaps defined between the same and the transmission line members 19 and 20 respectively. On the other hand, a second ground electrode 22 is formed substantially along the overall lower major surface of the substrate 18.

The holding patches 16 of the electronic component 11 are connected with the first ground electrode 21 through solder members 23, thereby fixing the electronic component 11 to the circuit board 17. Due to such a mounting structure for the electronic component 11, small clearances 24 correlated with the thicknesses of the solder members 23 are defined between the input/output-side external electrodes 12 and 13 and the transmission line members 19 and 20 respectively, and between the ground-side external electrodes 14 and 15 and the first ground electrode 21 respectively. The aforementioned solder members 23 may be replaced by a resin-based adhesive. In this case, it is not necessary to provide the electronic component 11 with the holding patches 16. Such replacement of a solder member by a resin-based adhesive is applicable to other embodiments described later.

According to this mounting structure for the electronic component 11, the input/output-side external electrodes 12 and 13 and the ground-side external electrodes 14 and 15 are electromagnetically coupled with the transmission line members 19 and 20 and the ground electrode 21 respectively through the small clearances 24. Consequently, this structure implements an equivalent circuit shown in FIG. 6.

Figure 6:
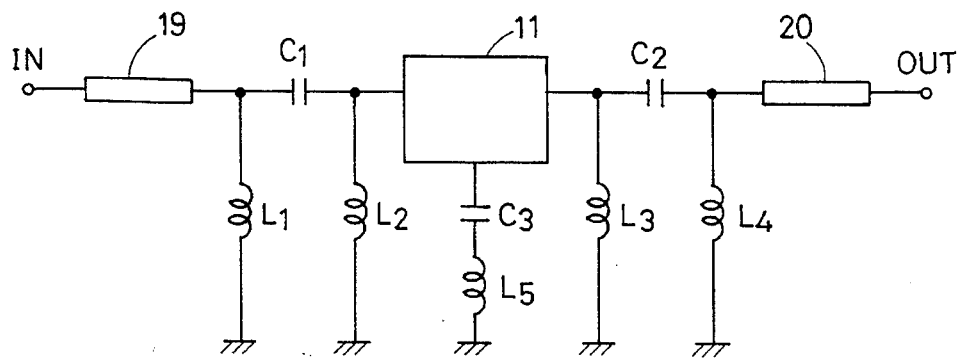
FIG. 6 is an equivalent circuit diagram of the mounting structure shown in FIG. 4.

Referring to FIG. 6, symbols L1, L2, L3, L4 and L5 denote ground-side parasitic inductance components of the circuit board 17. Symbols C1 and C2 denote capacitance components which are formed across the input/output-side external electrodes 12 and 13 and the transmission line members 19 and 20 respectively. Further, symbol C3 denotes a capacitance component which is formed across the ground-side external electrodes 14 and 15 and the first ground electrode 21. Thus, the input/output-side external electrodes 12 and 13 are electromagnetically coupled with the transmission line members 19 and 20 through the capacitance components C1 and C2 respectively, while the ground-side external electrodes 14 and 15 are electromagnetically coupled with the ground electrode 21 through the capacitance component C3. Further, the inductance components L1 and L2 and the capacitance component C1 as well as the inductance components L3 and L4 and the capacitance component C2 form high-pass filters respectively, whereby signals are transmitted in the frequency range exceeding the cut-off frequencies of these high-pass filters.

The inductance component L5, which is formed across the ground-side external electrodes 14 and 15 and the ground electrode 21, will not substantially influence the signals since its inductance is at an extremely small value. Thus, no inductance components substantially influencing the signals are developed in the signal transmission line members, whereby it is possible to draw the original electric characteristics of the electronic component 11 with fidelity.

The equivalent circuit shown in FIG. 6 is applicable to all mounting structures for electronic components according to various embodiments described later.

Figure 7:
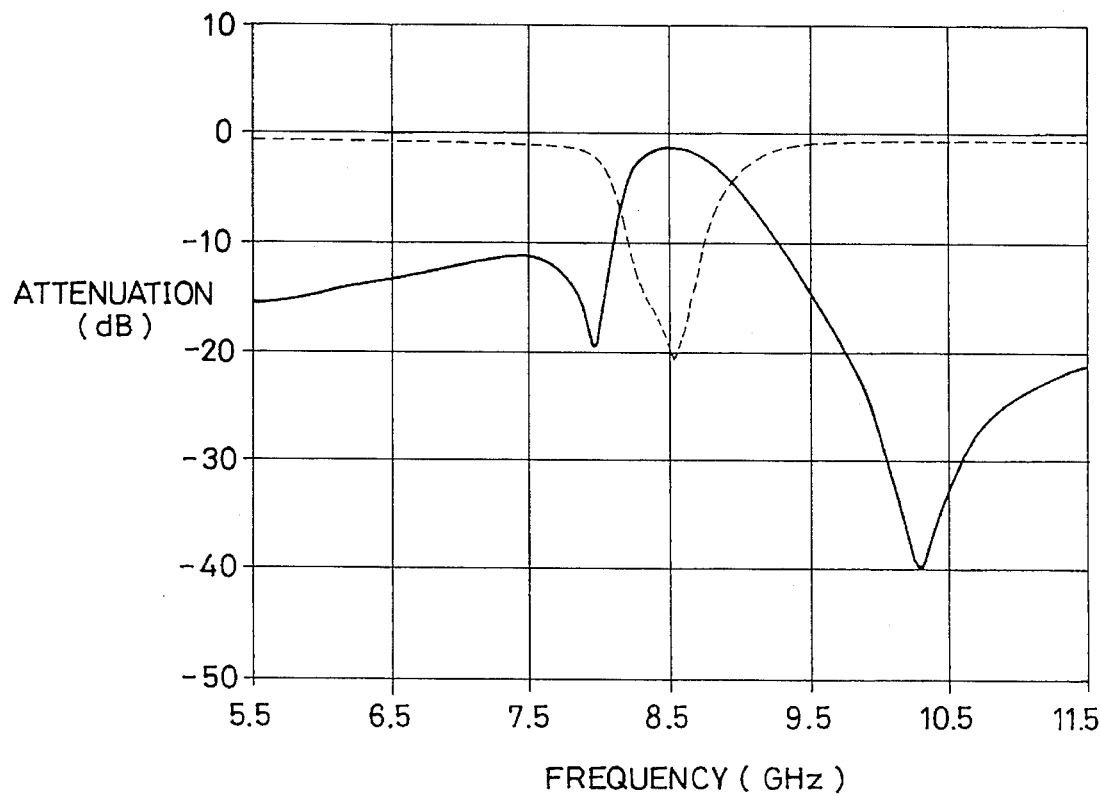
FIG. 7 illustrates filter characteristics of a band-pass filter employing the mounting structure shown in FIG. 4.

FIG. 7 shows filter characteristics of the structure shown in FIGS. 4 and 5 wherein a band-pass filter of the 8 GHz band which is formed by inductance-capacitance (LC) is the electronic component 11. Referring to FIG. 7, solid and phantom lines show transmission and reflection characteristics respectively. It is understood from FIG. 7 that the structure attains excellent characteristics with loss of −1.4 dB of the transmission characteristics at the central frequency and a reflection level of −21 dB.

Figure 8:
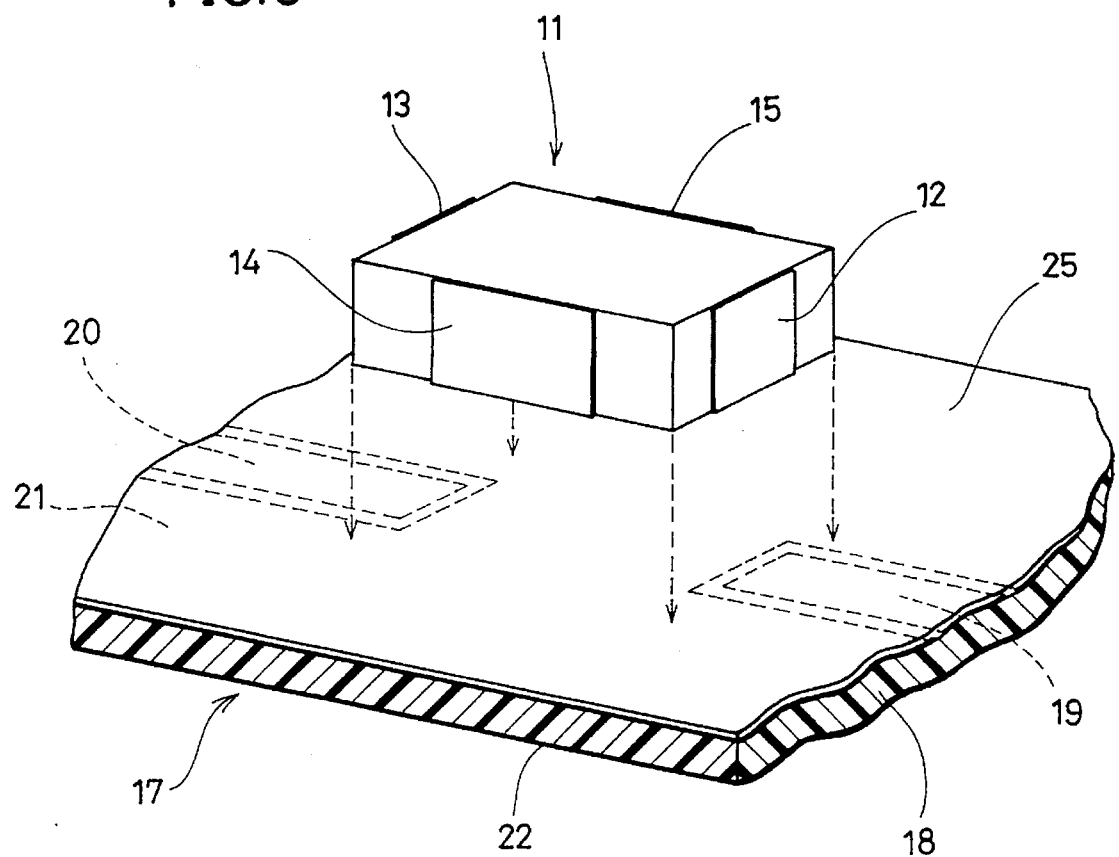
FIG. 8 is a perspective view showing a mounting structure for an electronic component according to a second embodiment of the present invention.
Figure 9:
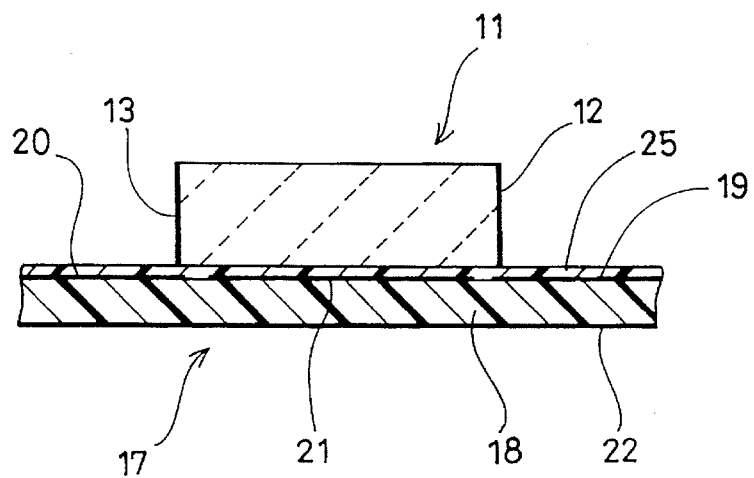
FIG. 9 is a sectional view of the mounting structure shown in FIG. 8.

FIGS. 8 and 9 illustrate the circuit board 17 shown in FIGS. 4 and 5. A resin layer 25 is formed on this circuit board 17 to cover the transmission line members 19 and 20 and the first ground electrode 21. This resin layer 25 preferably has adhesiveness, so that the electronic component 11 is fixed to the circuit board 17 through this adhesiveness. The electronic component 11 is mounted to extend over the transmission line members 19 and 20.

According to this embodiment, the input/output-side external electrodes 12 and 13 and the ground-side external electrodes 14 and 15 are electromagnetically coupled with the transmission line members 19 and 20 and the first ground electrode 21 respectively through the resin layer 25. According to this embodiment, it is not necessary to provide the holding patches 16 (FIG. 2) on the lower surface of the electronic component 11.

Figure 10:
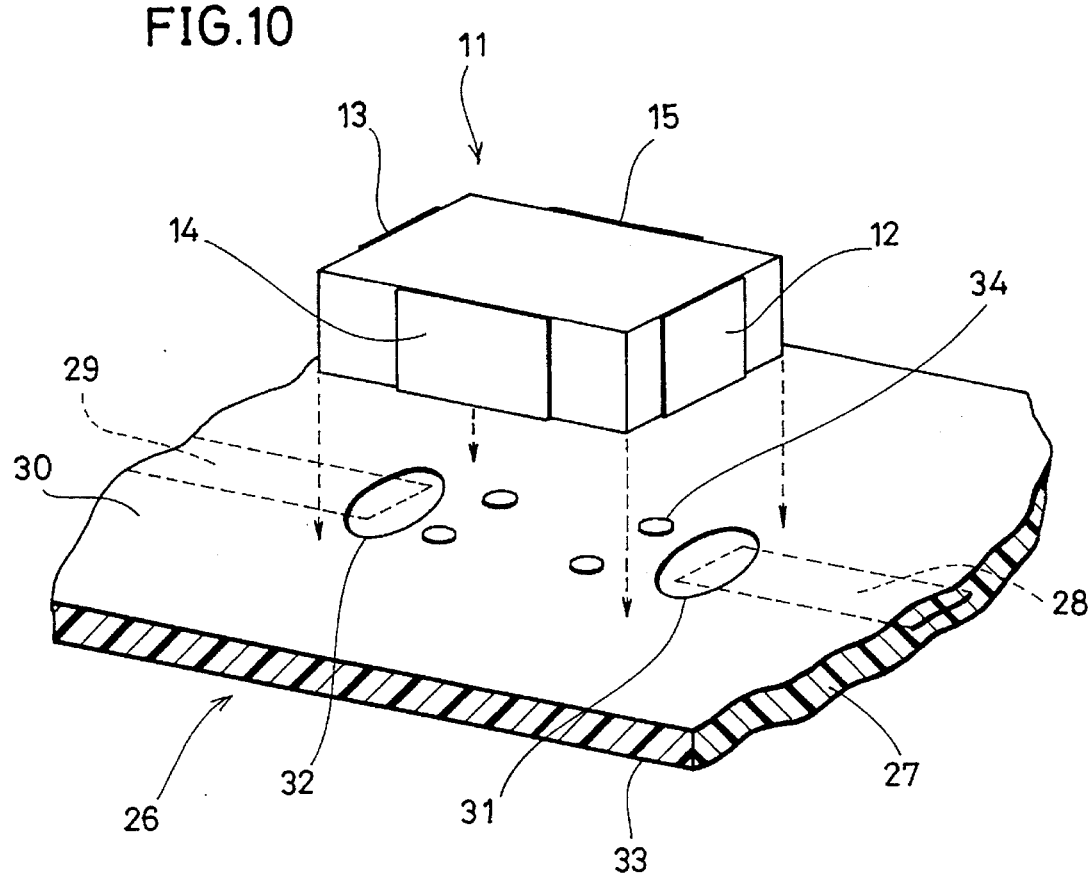
FIG. 10 is a perspective view showing a mounting structure for an electronic component according to a third embodiment of the present invention.
Figure 11:
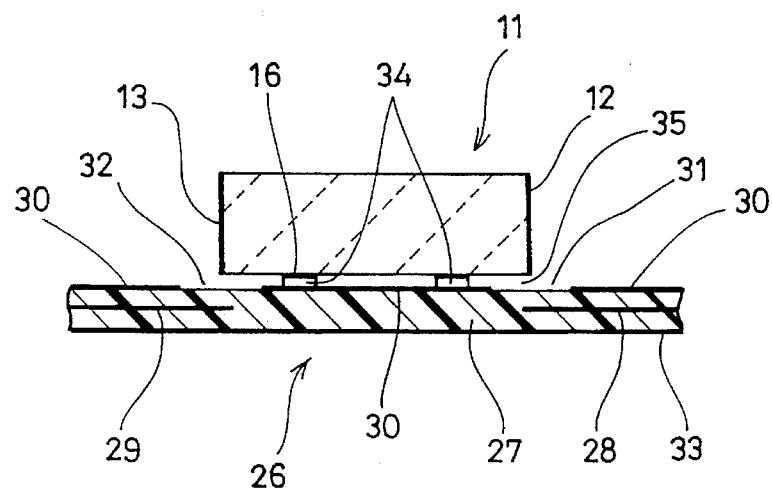
FIG. 11 is a sectional view of the mounting structure shown in FIG. 10.

Referring to FIGS. 10 and 11, a circuit board 26 comprises an insulating substrate 27 of a multilayer structure. Two linear transmission line members 28 and 29 are formed in the substrate 27 to extend in parallel with major surfaces of the substrate 27. The transmission line members 28 and 29 are opposed to each other on a straight line. A first ground electrode 30 is formed on the upper major surface of the substrate 27. The ground electrode 30 is provided with coupling windows 31 and 32 provided with no ground electrode 30 in positions opposed to end portions of the transmission line members 28 and 29 respectively. On the other hand, a second ground electrode 33 is formed substantially along the overall lower major surface of the substrate 27.

The holding patches 16 of the electronic component 11 are bonded to the first ground electrode 30 through solder members 34, thereby fixing the electronic component 11 to the circuit board 26. In such a mounting structure, the input/output-side external electrodes 12 and 13 are opposed to the transmission line members 28 and 29 through the coupling windows 31 and 32 respectively, while clearances 35 defined through the solder members 34, the coupling windows 31 and 32, and parts of the substrate 26 are interposed between the external electrodes 12 and 13 and the transmission line members 28 and 29. Further, clearances 35 are defined through the solder members 34 between the ground-side external electrodes 14 and 15 and the first ground electrode 30.

Thus, the input/output-side external electrodes 12 and 13 are electromagnetically coupled with the transmission line members 28 and 29 through the coupling windows 31 and 32 respectively. On the other hand, the ground-side external electrodes 14 and 15 are electromagnetically coupled with the first ground electrode 30 through the small clearances 35.

Figure 12:
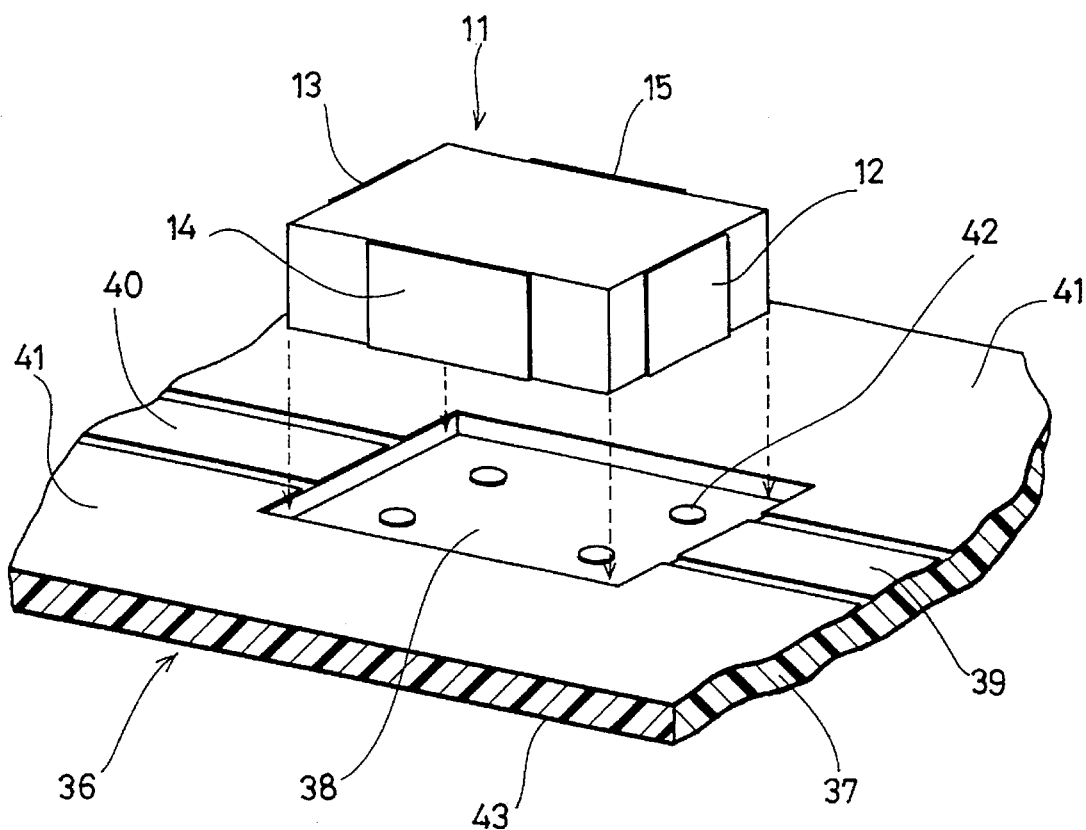
FIG. 12 is a perspective view showing a mounting structure for an electronic component according to a fourth embodiment of the present invention.
Figure 13:
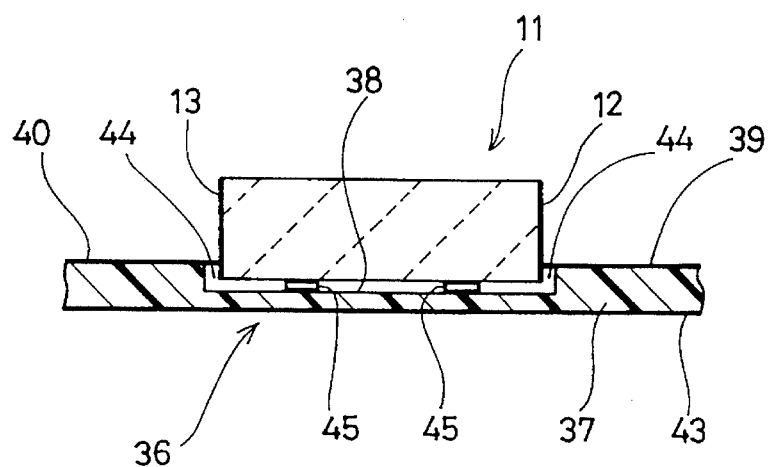
FIG. 13 is a sectional view of the mounting structure shown in FIG. 12.

Referring to FIGS. 12 and 13, a circuit board 36 comprises an electric insulating substrate 37. A concave portion 38 having a bottom surface and inner side surfaces is formed on an upper major surface of the substrate 37. Further, two linear transmission line members 39 and 40 are formed on the upper major surface of the substrate 37. These transmission line members 39 and 40 are formed to extend to edges defining an opening of the concave portion 38 respectively. Further, a first ground electrode 41 is formed on the upper major surface of the substrate 37. This ground electrode 41 is formed through prescribed gaps with respect to the transmission line members 39 and 40, to be electrically insulated from the same. The ground electrode 41 is formed to extend to edges defining the opening of the concave portion 38. A plurality of holding patches 42, made of metal films, corresponding to the aforementioned holding patches 16 are formed on the bottom surface of the concave portion 38. On the other hand, a second ground electrode 43 is formed substantially along the overall lower major surface of the substrate 37.

The electronic component 11 is partially received in the concave portion 38 while directing its lower surface to the bottom surface of the concave portion 38, directing the external electrodes 12 to 15 to the inner side surfaces of the concave portion 38 and defining small clearances 44 between the external electrodes 12 to 15 and the inner surfaces of the concave portion 38. In this state, the holding patches 42 provided in the concave portion 38 are bonded with the holding patches 16 provided on the electronic component 11 by solder members 45, thereby fixing the electronic component 11 to the circuit board 36. In this mounting structure, the input/output-side external electrodes 12 and 13 and the ground-side external electrodes 14 and 15 are electromagnetically coupled with the transmission line members 39 and 40 and the first ground electrode 41 respectively through the clearances 44.

Figure 14:
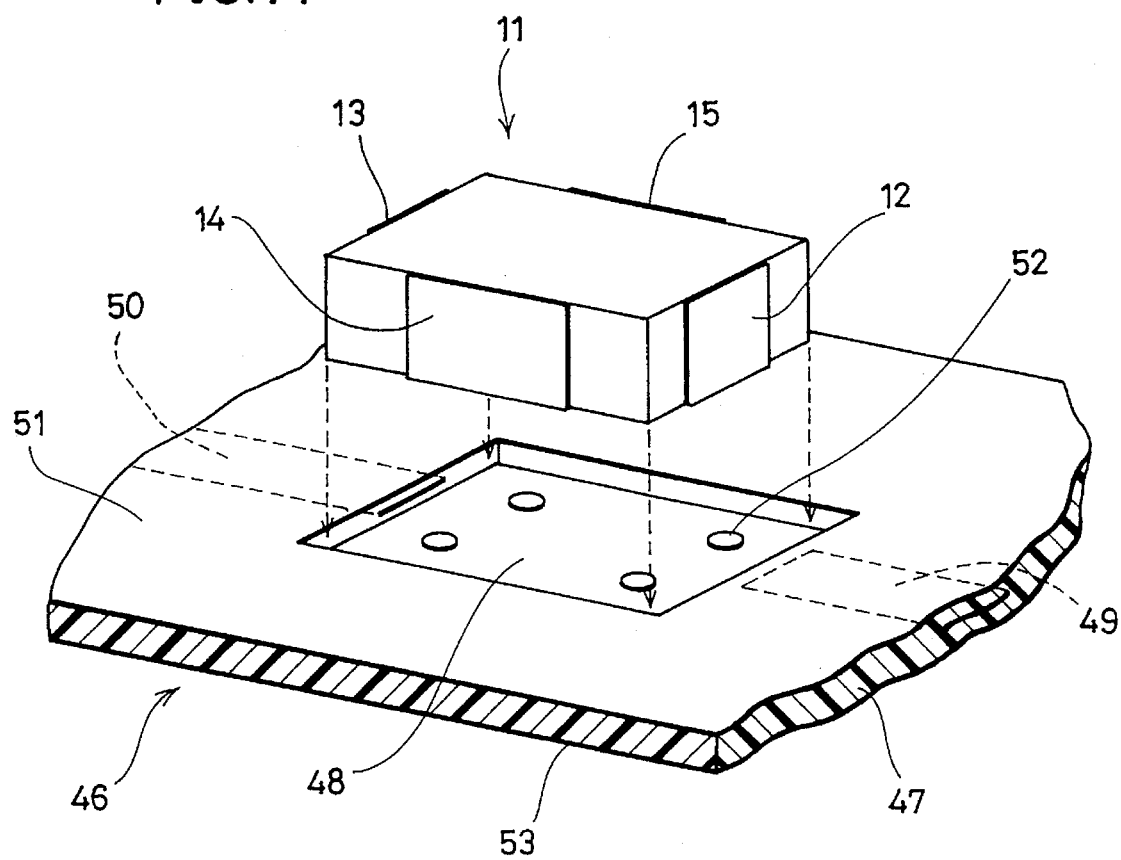
FIG. 14 is a perspective view showing a mounting structure for an electronic component according to a fifth embodiment of the present invention.
Figure 15:
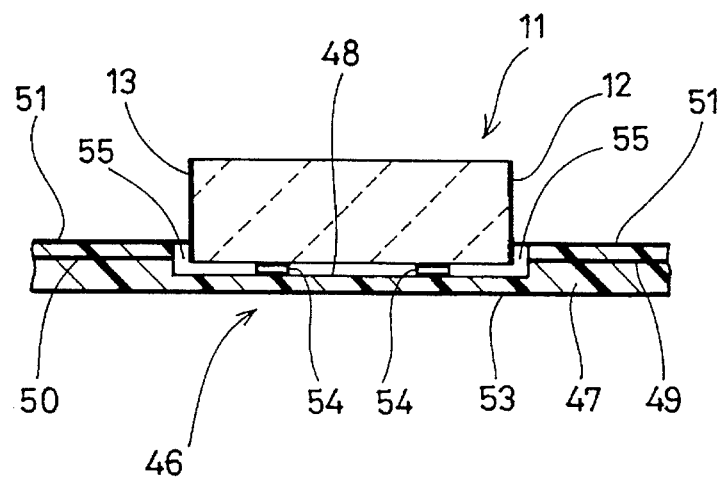
FIG. 15 is a sectional view of the mounting structure shown in FIG. 14.

Referring to FIGS. 14 and 15, a circuit board 47 comprises an electric insulating substrate 47 of a multilayer structure. A concave portion 48 is formed in an upper major surface of the substrate 47. Two linear transmission line members 49 and 50 are formed in the substrate 47 to extend on a straight line. End portions of the transmission line members 49 and 50 are exposed on inner side surfaces of the concave portion 48, to be opposed to each other. Further, a first ground electrode 51 is formed on the upper major surface of the substrate 47. This ground electrode 51 extends to edges defining an opening of the concave portion 48. A plurality of holding patches 52 are formed on a bottom surface of the concave portion 48. In addition, a second ground electrode 53 is formed substantially along the overall lower major surface of the substrate 47.

The electronic component 11 is partially received in the concave portion 48, and holding patches 16 (FIG. 2) are bonded to the holding patches 52 through solder members 54, thereby mounting the electronic component 11 on the circuit board 46. In this state, small clearances 55 are defined between inner side surfaces of the concave portion 48 and the external electrodes 12 to 15. Thus, the input/output-side external electrodes 12 and 13 and the ground-side external electrodes 14 and 15 are electromagnetically coupled with the transmission line members 49 and 50 and the first ground electrode 51 respectively through the clearances 55.

Figure 16:
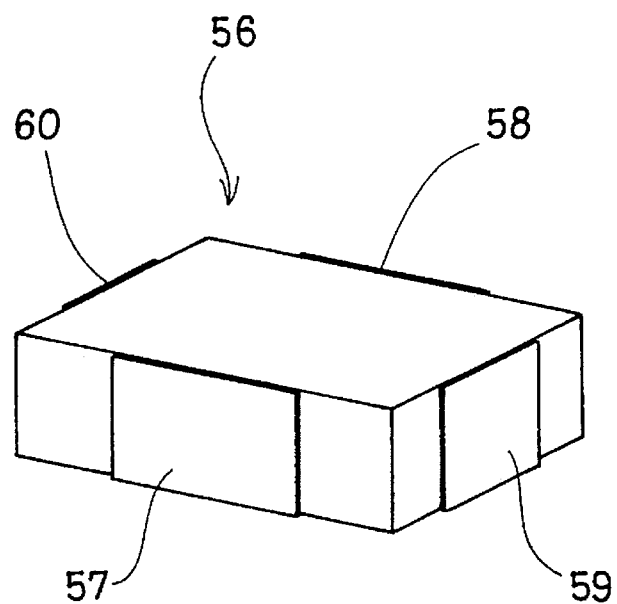
FIG. 16 is a perspective view showing another exemplary electronic component to which the present invention is applied.
Figure 17:
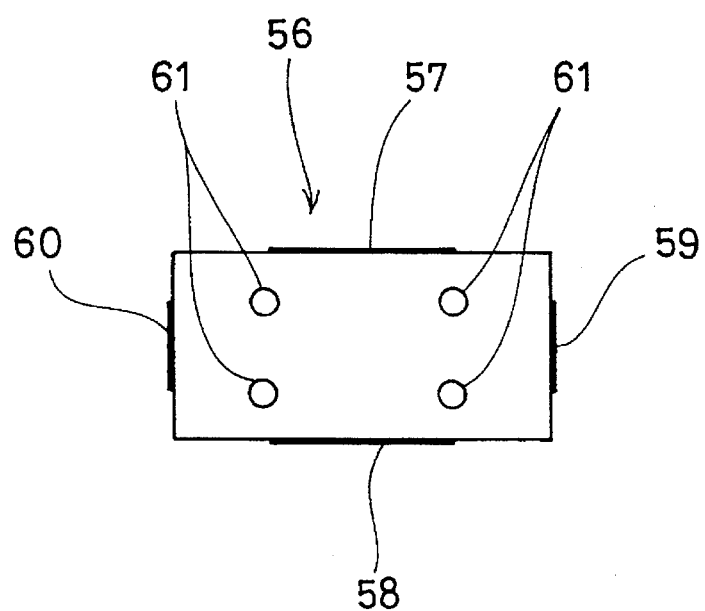
FIG. 17 is a bottom plan view of the electronic component shown in FIG. 16.

FIGS. 16 and 17 illustrate another exemplary electronic component 56 to which the present invention is applied. The electronic component 56 shown in FIGS. 16 and 17 is substantially similar in appearance to the electronic component 11 shown in FIGS. 1 and 2, while input/output-side external electrodes 57 and 58 are formed on longer side surfaces to be opposed to each other, and ground-side external electrodes 59 and 60 are formed on shorter side surfaces to be opposed to each other. Further, a plurality of holding patches 61 are formed by metal films on a bottom surface of the electronic component 56. FIGS. 18 and 19, 20 and 21, and 22 and 23 illustrate some exemplary mounting structures for this electronic component 56.

Figure 18:
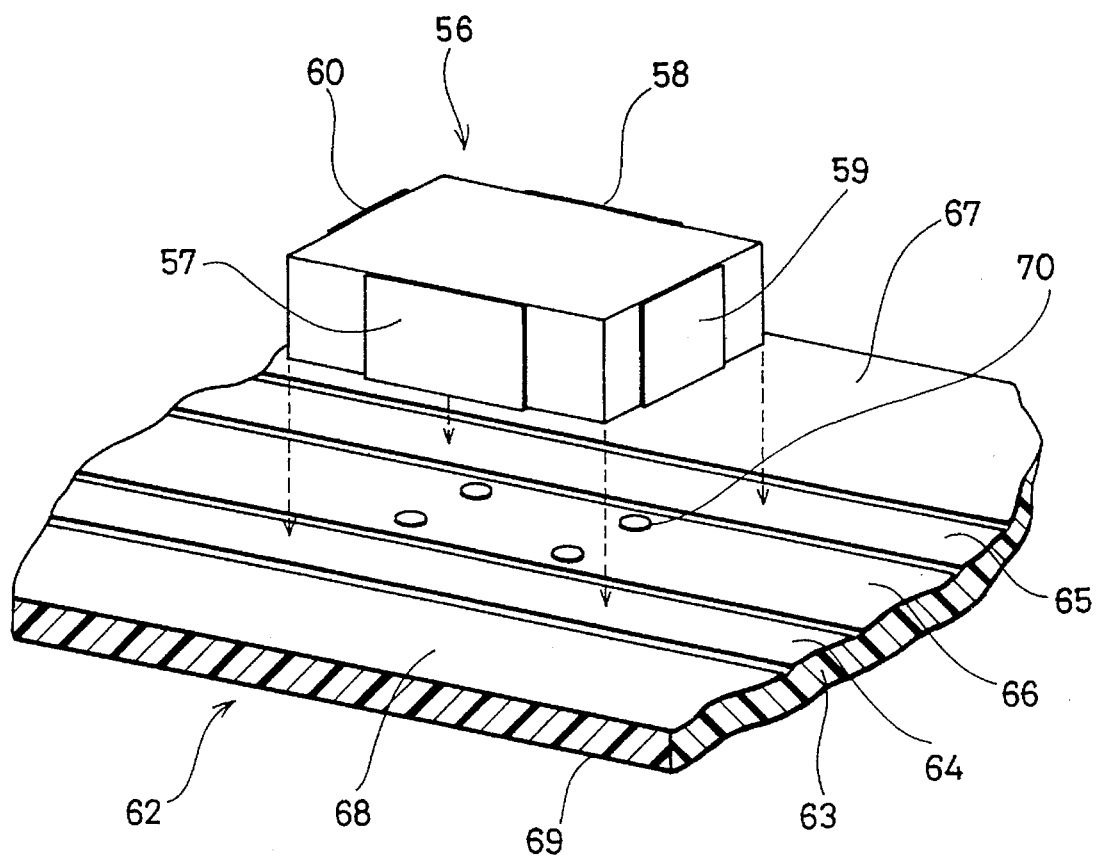
FIG. 18 is a perspective view showing a mounting structure for an electronic component according to a sixth embodiment of the present invention.
Figure 19:
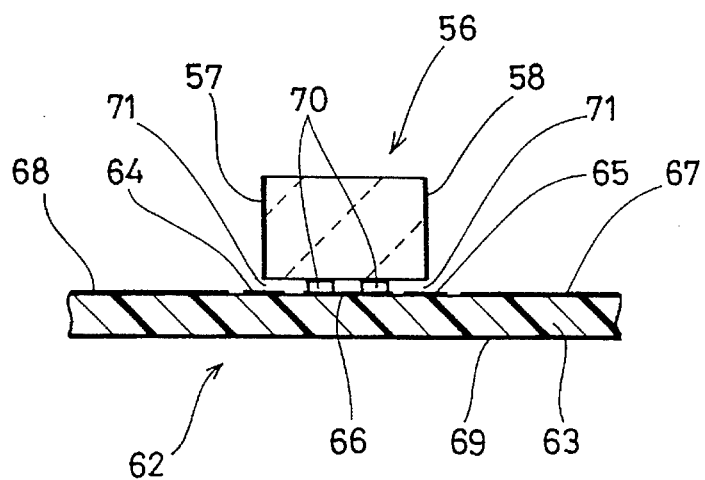
FIG. 19 is a sectional view of the mounting structure shown in FIG. 18.

Referring to FIGS. 18 and 19, a circuit board 62 comprises an electric insulating substrate 63. Two linear transmission line members 64 and 65 are formed on an upper major surface of the substrate 63, to extend in parallel with each other. Further, ground electrodes 66, 67 and 68 which are electrically insulated from the transmission line members 64 and 65 through prescribed gaps are formed on the upper major surface of the substrate 63. On the other hand, an ground electrode 69 is formed substantially along the overall lower major surface of the substrate 63.

The input/output-side external electrodes 57 and 58 of the electronic component 56 are arranged to be positioned on the transmission line members 64 and 65 respectively, and the holding patches 61 are bonded to the ground electrode 66 through solder members 70, thereby fixing the electronic component 56 to the circuit board 62. In such a mounting structure, small clearances 71 are defined through the solder members 70 between the internal electrodes 57 to 60 and the transmission line members 64 and 65 as well as the ground electrode 66. Therefore, the input/output-side external electrodes 57 and 58 and the ground-side external electrodes 59 and 60 are electromagnetically coupled with the transmission line members 64 and 65 and the ground electrode 66 respectively through the clearances 71.

Figure 20:
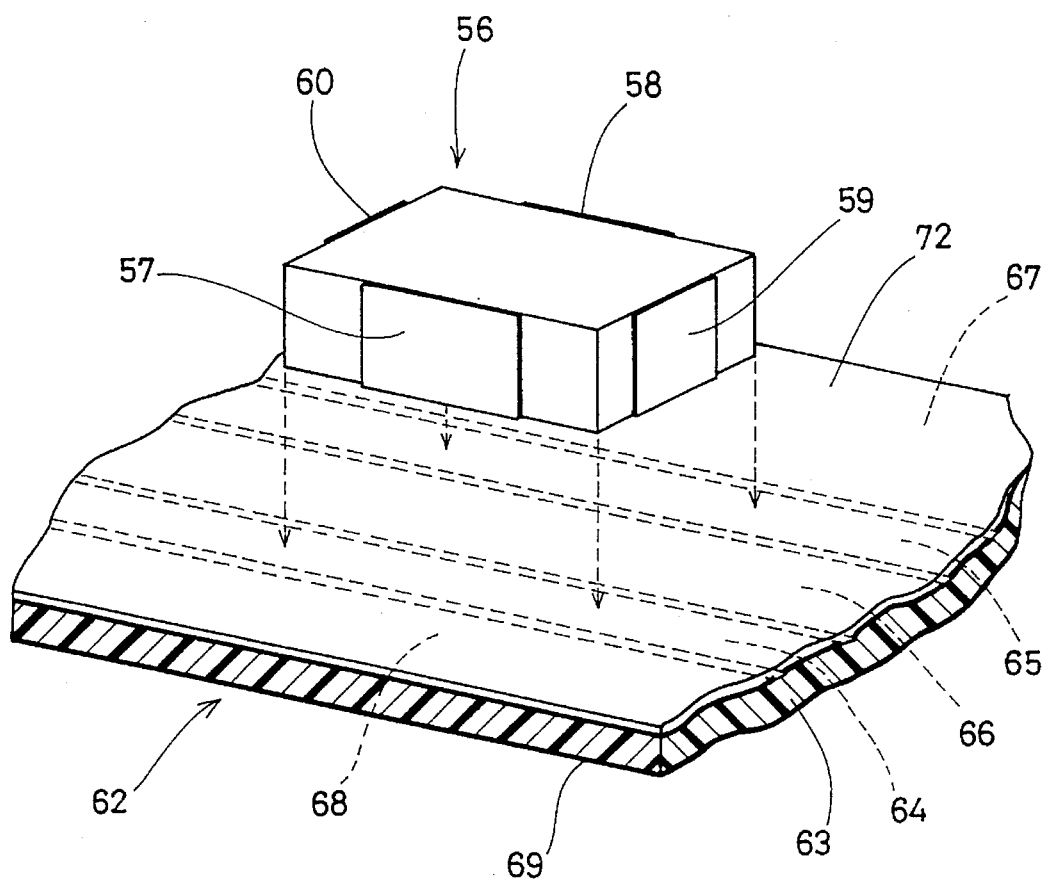
FIG. 20 is a perspective view showing a mounting structure for an electronic component according to a seventh embodiment of the present invention.
Figure 21:
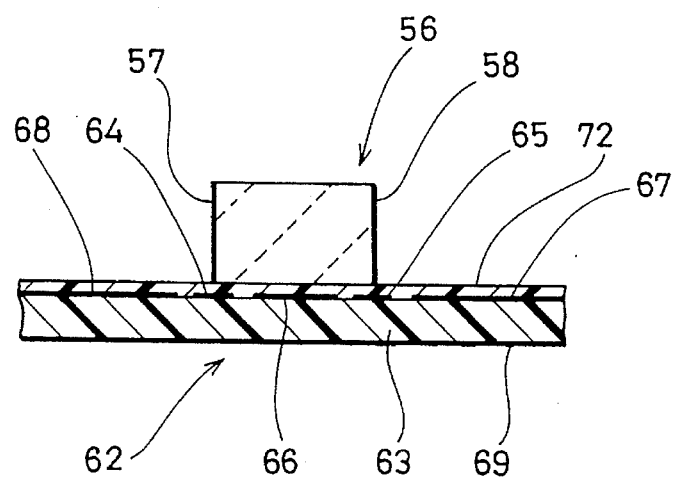
FIG. 21 is a sectional view of the mounting structure shown in FIG. 20.

FIGS. 20 and 21 illustrate the circuit board 62 shown in FIGS. 18 and 19. In the embodiment shown in FIGS. 20 and 21, a resin layer 72 is formed to cover the transmission line members 64 and 65 and the ground electrodes 66 to 68. The resin layer 72 preferably has adhesiveness so that the electronic component 56 is fixed to the circuit board 62 on the basis of this adhesiveness. The electronic component 56 is arranged to extend over the two transmission line members 64 and 65.

According to this mounting structure, the input/output-side external electrodes 57 and 58 and the ground-side external electrodes 59 and 60 are electromagnetically coupled with the transmission line members 64 and 65 and the ground electrode 66 respectively through the resin layer 71.

Figure 22:
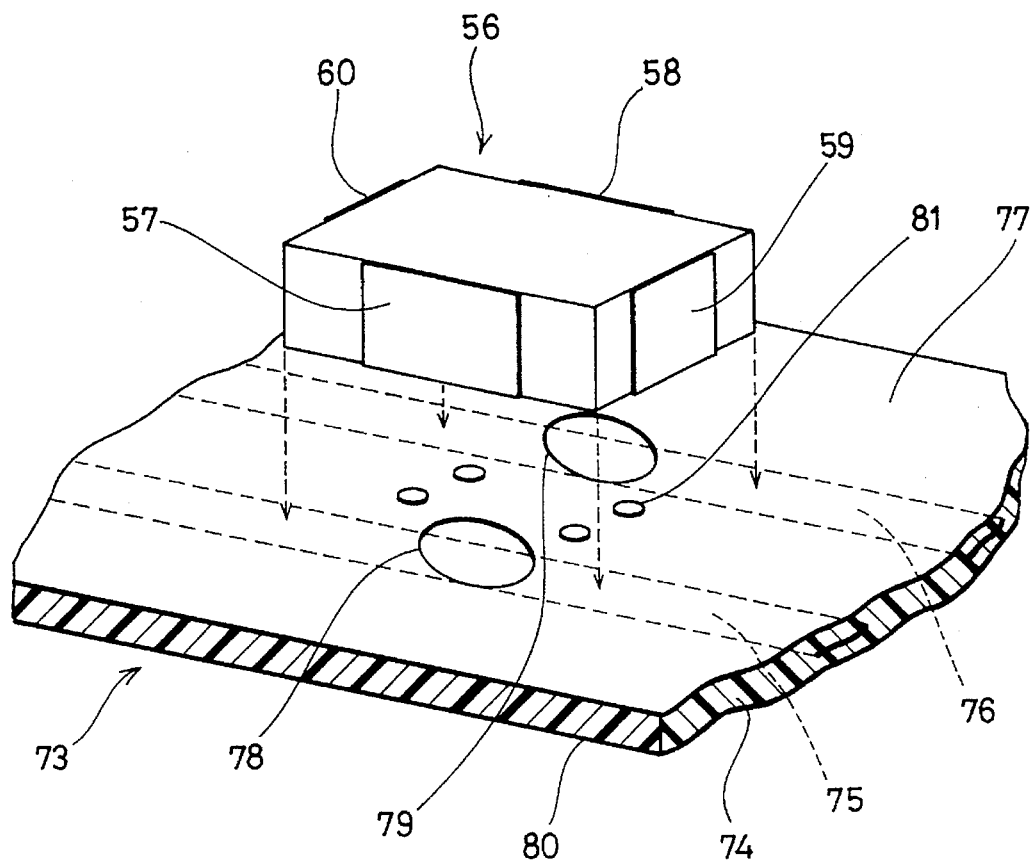
FIG. 22 is a perspective view showing a mounting structure for an electronic component according to an eighth embodiment of the present invention.
Figure 23:
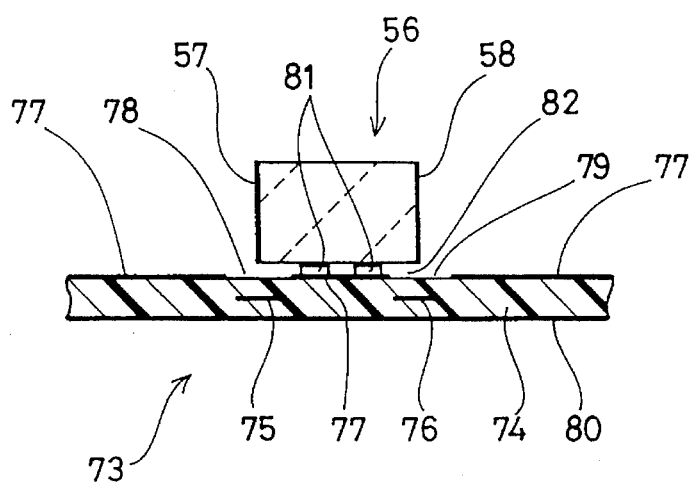
FIG. 23 is a sectional view of the mounting structure shown in FIG. 22.

Referring to FIGS. 22 and 23, a circuit board 73 comprises an electric insulating substrate 74 of a multilayer structure. Two linear transmission line members 75 and 76 are formed in the substrate 74 to extend in parallel with major surfaces of the substrate 74. These transmission line members 75 and 76 extend in parallel with each other. A first ground electrode 77 is formed on the upper major surface of the substrate 74. Coupling windows 78 and 79 are formed in the ground electrode 77 in positions opposed to the transmission line members 75 and 76 respectively. On the other hand, a second ground electrode 80 is formed substantially along the overall lower major surface of the substrate 74.

The electronic component 56 is arranged on the circuit board 73 so that the input/output-side external electrodes 57 and 58 are opposed to the transmission line members 75 and 76 through the coupling windows 78 and 79 respectively. In this state, the holding patches 61 (FIG. 17) of the electronic component 56 are bonded to the first ground electrode 77 by solder members 81, thereby fixing the electronic component 56 to the circuit board 73.

In the aforementioned mounting structure, small clearances 82 defined through the solder members 81, the coupling windows 78 and 79, and parts of the substrate 74 are interposed between the input/output-side external electrodes 57 and 58 and the transmission line members 75 and 76 respectively. Further, small clearances 82 are defined through the solder members 81 between the ground-side external electrodes 59 and 60 and the first ground electrode 77. Thus, the input/output-side external electrodes 57 and 58 and the transmission line members 75 and 76 are electromagnetically coupled with each other through the coupling windows 78 and 79, while the ground-side external electrodes 59 and 60 and the first ground electrode 77 are electromagnetically coupled with each other through the clearances 82 respectively.

Figure 24:
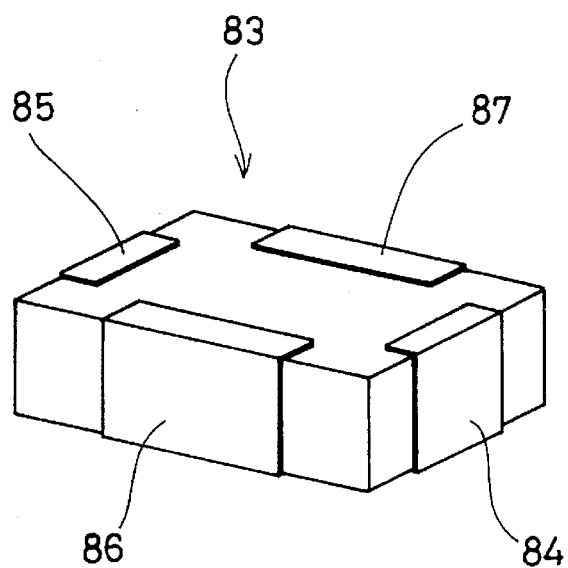
FIG. 24 is a perspective view showing still another exemplary electronic component to which the present invention is applied.
Figure 25:
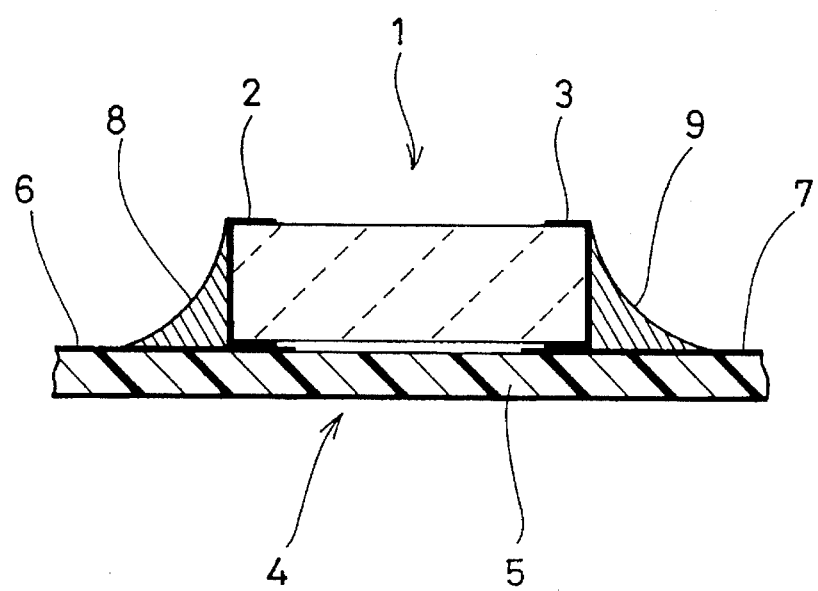
FIG. 25 is a sectional view showing a conventional mounting structure for an electronic component.

FIG. 24 illustrates still another exemplary electronic component 83 to which the present invention is applied. The electronic component 83 shown in FIG. 24 comprises external electrodes 84 to 87 for serving as input/output-side and/or ground-side electrodes. These external electrodes 84 to 87 are formed to extend not only on side surfaces but toward upper and lower surfaces of the electronic component 83. This electronic component 83 can be employed in place of the aforementioned electronic component 11 or 56.

Figure 26:
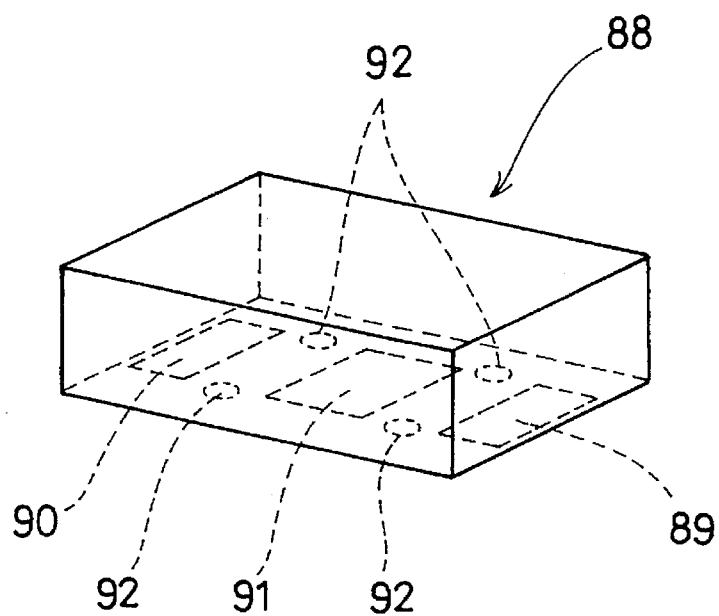
FIG. 26 is a perspective view showing a further exemplary electronic component to which the present invention is applied.
Figure 27:
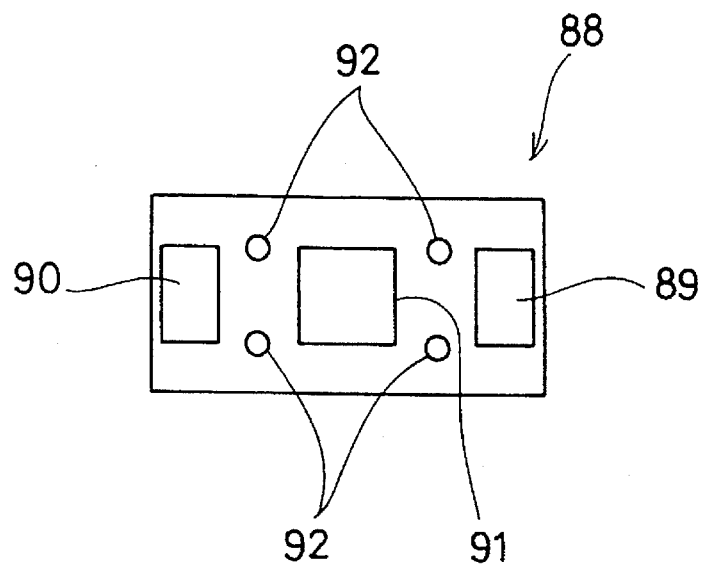
FIG. 27 is a bottom plan view of the electronic component shown in FIG. 26.

FIGS. 26 and 27 illustrate a further exemplary electronic component 88 to which the present invention is applied. The electronic component 88 shown in FIGS. 26 and 27 comprises input/output-side external electrodes 89 and 90 and an ground-side external electrode 91 as external terminals. All of these external electrodes 89 to 91 are formed on a lower surface of the electronic component 88 in the form of patches. More specifically, the input/output-side external electrodes 89 and 90 are positioned on respective end portions of the lower surface of the electronic component 88, while the ground-side external electrode 91 is positioned on its central portion. Further, a plurality of holding patches 92 are formed by metal films between the input/output-side external electrodes 89 and 90 and the ground-side external electrode 91.

FIGS. 28 and 29, 30 and 31, and 32 and 33 illustrate some exemplary mounting structures for the aforementioned electronic component 88.

Figure 28:
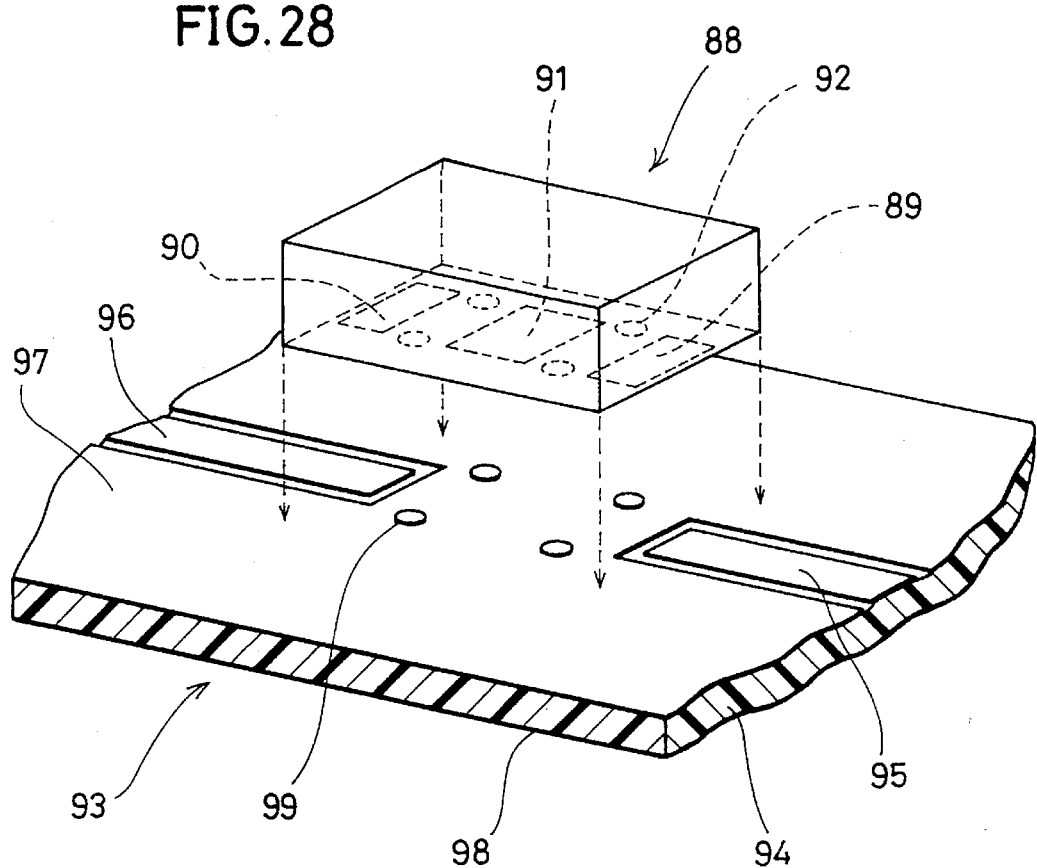
FIG. 28 is a perspective view showing a mounting structure for an electronic component according to a ninth embodiment of the present invention.
Figure 29:
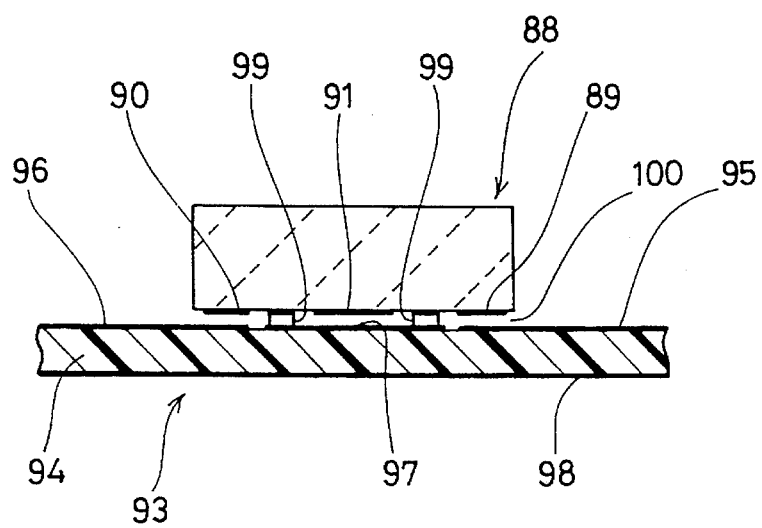
FIG. 29 is a sectional view of the mounting structure shown in FIG. 28.

FIGS. 28 and 29 illustrate a circuit board 93 which is substantially similar in structure to the circuit board 17 shown in FIGS. 4 and 5. This circuit board 93 comprises an electric insulating substrate 94. Two linear transmission line members 95 and 96 and a first ground electrode 97 are formed on an upper major surface of the substrate 94. On the other hand, a second ground electrode 98 is formed substantially along the overall lower major surface of the substrate 94.

The electronic component 88 is aligned with the circuit board 93 so that the input/output-side external electrodes 89 and 90 are opposed to the transmission line members 95 and 96 respectively. The holding patches 92 of the electronic component 88 are bonded to the first ground electrode 97 by solder members 99, thereby fixing the electronic component 88 to the circuit board 93.

In such a mounting structure, small clearances 100 are defined through the solder members 99 between the input/output-side external electrodes 89 and 90 and the transmission line members 95 and 96, and between the ground-side external electrode 91 and the first ground electrode 97 respectively. Therefore, the input/output-side external electrodes 99 and 90 and the ground-side external electrode 91 are electromagnetically coupled with the transmission line members 95 and 96 and the first ground electrode 97 respectively through the clearances 100.

Figure 30:
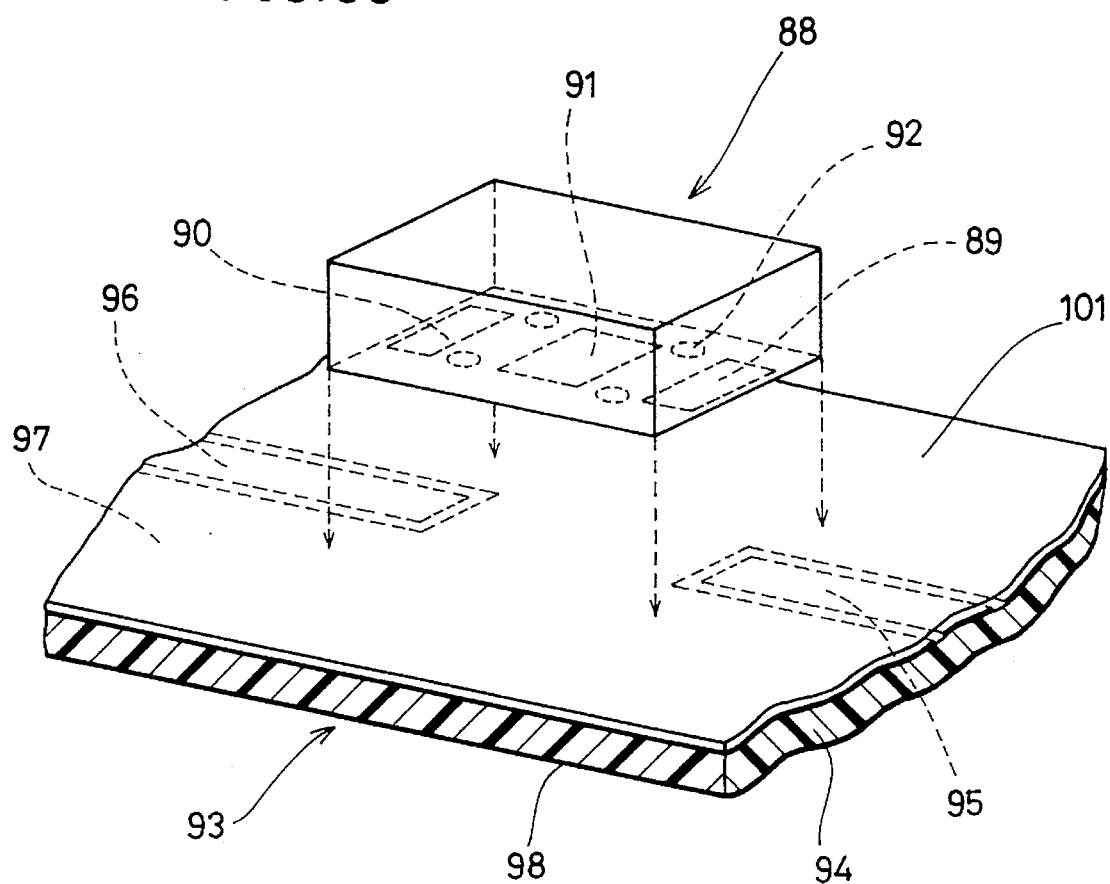
FIG. 30 is a perspective view showing a mounting structure for an electronic component according to a tenth embodiment of the present invention.
Figure 31:
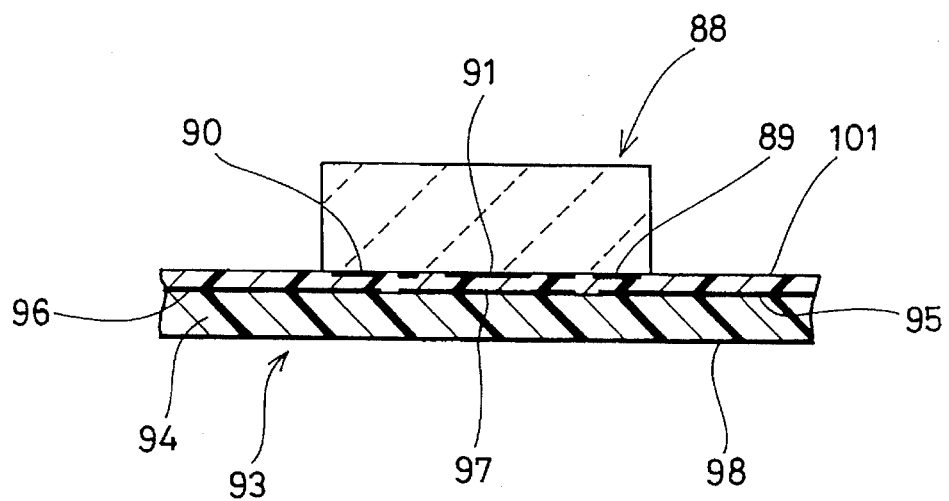
FIG. 31 is a sectional view of the mounting structure shown in FIG. 30.

FIGS. 30 and 31 illustrate the circuit board 93 shown in FIGS. 28 and 29. In the embodiment shown in FIGS. 30 and 31, a resin layer 101 is formed to cover the transmission line members 95 and 96 and the first ground electrode 97, similarly to the aforementioned embodiment shown in FIGS. 8 and 9. The resin layer 101 preferably has adhesiveness, so that the electronic component 88 is bonded to the circuit board 93 through this resin layer 101.

In such a mounting structure, the input/output-side external electrodes 89 and 90 are opposed to the transmission line members 95 and 96 through the resin layer 101 respectively, while the ground-side external electrode 91 is also opposed to the first ground electrode 97 through the resin layer 101. Therefore, the input/output-side external electrodes 89 and 90 and the ground-side external electrode 91 are electromagnetically coupled with the transmission line members 95 and 96 and the first ground electrode 97 respectively through the resin layer 101.

Figure 32:
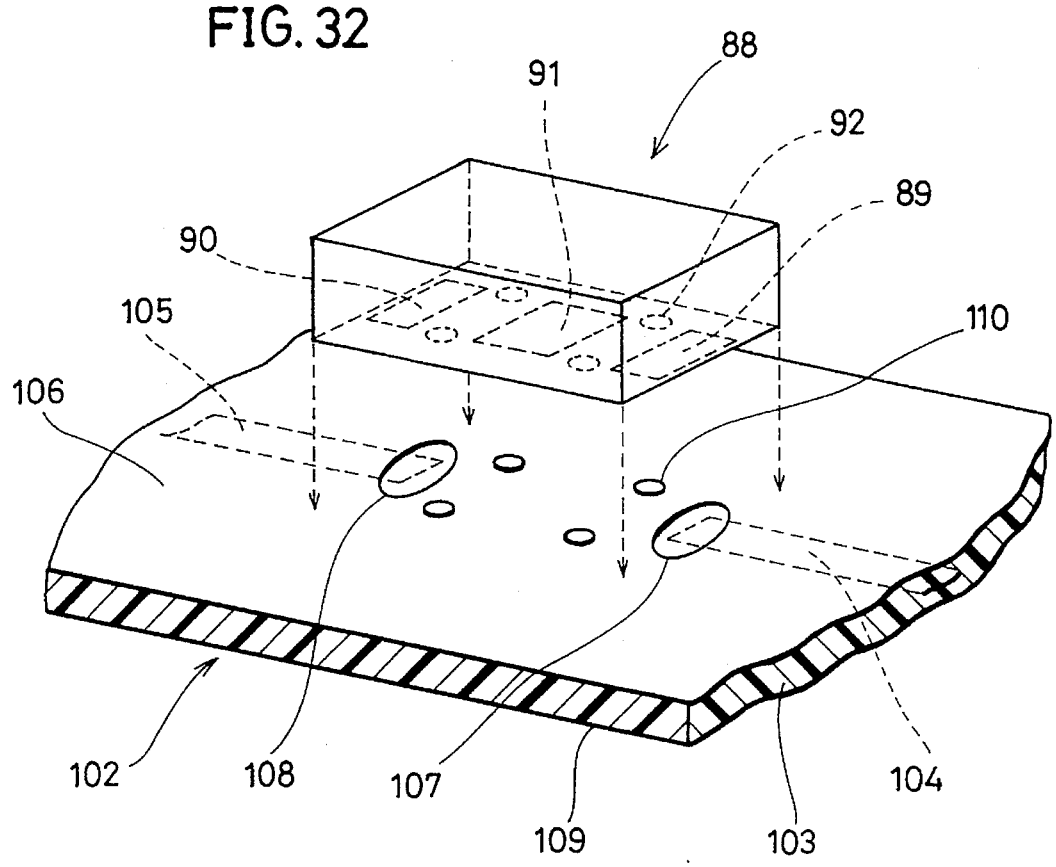
FIG. 32 is a perspective view showing a mounting structure for an electronic component according to an eleventh embodiment of the present invention.
Figure 33:
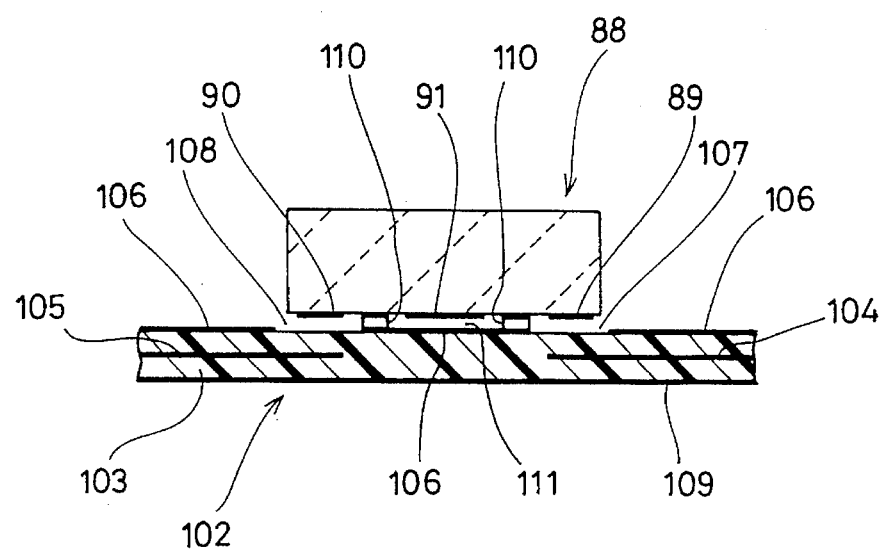
FIG. 33 is a sectional view of the mounting structure shown in FIG. 32.

FIGS. 32 and 33 illustrate a circuit board 102 which is substantially similar in structure to the circuit board 26 shown in FIGS. 10 and 11. The circuit board 102 comprises an electric insulating substrate 103 of a multilayer structure. Two linear transmission line members 104 and 105 are formed in the substrate 103 to be opposed to each other on a straight line. Further, a first ground electrode 106 is formed on an upper major surface of the substrate 103. Coupling windows 107 and 108 are formed in the ground electrode 106 in positions opposed to end portions of the transmission line members 104 and 105 respectively. In addition, a second ground electrode 109 is formed substantially along the overall lower major surface of the substrate 103.

The electronic component 88 is so aligned with the circuit board 102 that the input/output-side external electrodes 89 and 90 are opposed to the transmission line members 104 and 105 through the coupling windows 107 and 108 respectively, and the holding patches 92 are bonded to the first ground electrode 106 by solder members 110, thereby fixing the electronic component 88 to the circuit board 102.

In such a mounting structure, small clearances 111 defined through the solder members 110, the coupling windows 107 and 108, and parts of the substrate 103 are interposed between the input/output-side external electrodes 89 and 90 and the transmission line members 104 and 105 respectively. On the other hand, small clearances 111 defined through the solder members 110 are interposed between the ground-side external electrode 91 and the first ground electrode 106. Therefore, the input/output-side external electrodes 89 and 90 and the transmission line members 104 and 105 are electromagnetically coupled with each other through the coupling windows 107 and 108 respectively. Further, the ground-side external electrode 91 and the first ground electrode 106 are electromagnetically coupled with each other through the clearances 11.

Figure 34:
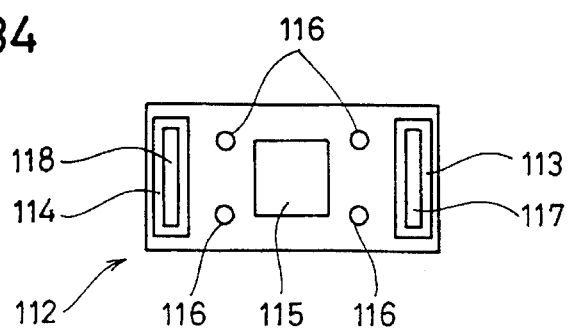
FIG. 34 is a bottom plan view showing a further exemplary electronic component to which the present invention is applied.

FIG. 34 is a bottom plan view showing an electronic component 112, which can be employed in place of the electronic component 88 shown in FIGS. 26 and 27. Input/output-side external electrodes 113 and 114, a ground-side external electrode 115, and holding patches 116 are formed on a lower surface of this electronic component 112, in arrangement which is substantially similar to that in the electronic component 88 shown in FIG. 27. This electronic component 112 is characterized in that the input/output-side external electrodes 113 and 114 are slot line electrodes having slots 117 and 118 which are provided with no conductors respectively.

Figure 35:
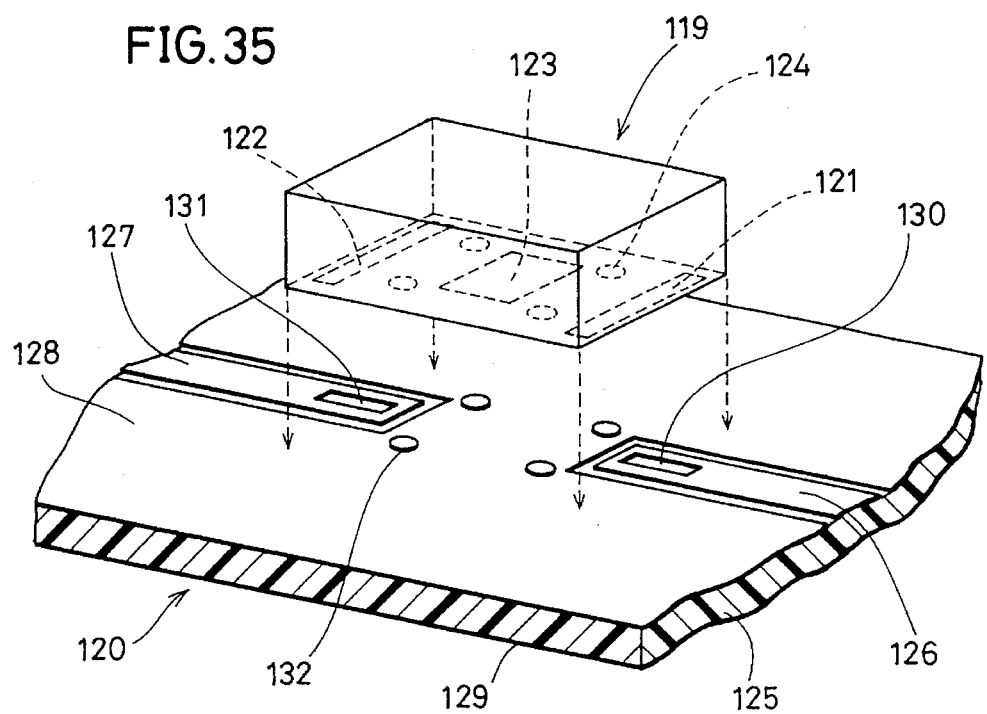
FIG. 35 is a perspective view showing a mounting structure for an electronic component according to a twelfth embodiment of the present invention.
Figure 36:
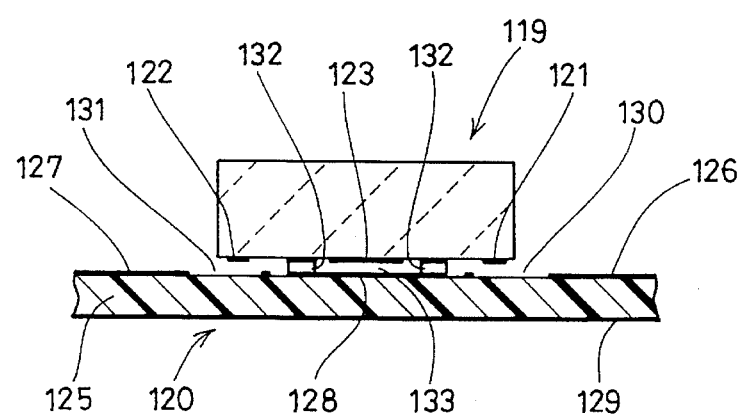
FIG. 36 is a sectional view of the mounting structure shown in FIG. 35.

FIGS. 35 and 36 illustrate an electronic component 119 and a circuit board 120 which are similar to the electronic component 88 and the circuit board 93 shown in FIGS. 28 and 29 respectively.

Input/output-side external electrodes 121 and 122, a ground-side external electrode 123 and holding patches 124 are formed on a lower surface of the electronic component 119, in arrangement which is substantially similar to that in the electronic component 88. This electronic component 119 is characterized in that the input/output-side external electrodes 121 and 122 are line electrodes.

On the other hand, the circuit board 120 comprises, similarly to the circuit board 93, an electric insulating substrate 125 and transmission line members 126 and 127 and a first ground electrode 128 are formed on an upper major surface of the substrate 125 while a second ground electrode 129 is formed on a lower major surface of the substrate 125 respectively. This circuit board 120 is characterized in that the transmission line members 126 and 127 are slot line electrodes having slots 130 and 131 which are provided with no conductors on respective end portions thereof.

Similarly to the electronic component 88, the holding patches 124 of the electronic component 119 are bonded to the first ground electrode 128 by solder members 132, thereby fixing the electronic component 119 to the circuit board 120. In such a mounting structure, the external electrodes 121 to 123 are electromagnetically coupled with the transmission line members 126 and 127 and the first ground electrode 128 through small clearances 133 defined through the solder members 132 respectively.

When the electronic component 119 has the line input/output-side external electrodes 121 and 122 as hereinabove described, these external electrodes 121 and 122 and the transmission line members 126 and 127 preferably extend along directions which are perpendicular to each other. This also applies to the electronic component 112 having the slot line input/output-side external electrodes 113 and 114 as shown in FIG. 34.

Figure 37:
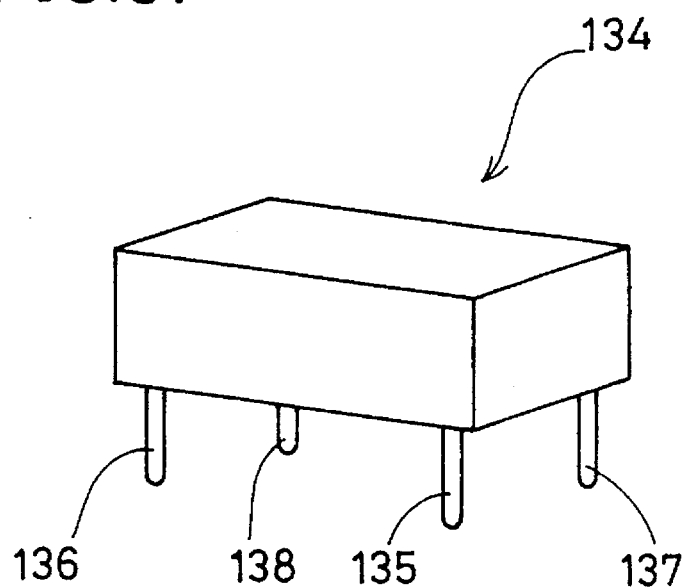
FIG. 37 is a perspective view showing a further exemplary electronic component to which the present invention is applied.
Figure 38:
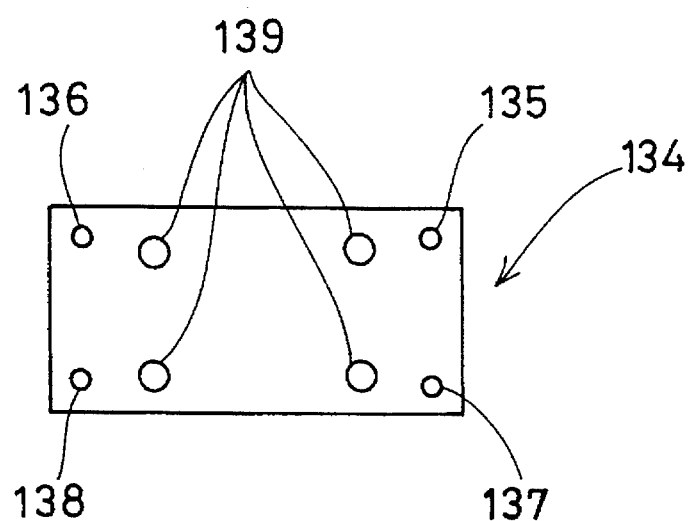
FIG. 38 is a bottom plan view of the electronic component shown in FIG. 37.

FIGS. 37 and 38 illustrate a further exemplary electronic component 134 to which the present invention is applied. The electronic component 134 shown in FIGS. 37 and 38 comprises pin type input/output-side lead terminals 135 and 136 and ground-side lead terminals 137 and 138, as external terminals, which are made of a metal. These lead terminals 135 to 138 are perpendicularly drawn out from a lower surface of the electronic component 134 respectively. Further, a plurality of holding patches 139 are formed by metal films on the lower surface of the electronic component 134.

FIGS. 39 and 40, 41 and 42, 43 and 44, 45, 46 and 47, and 48 and 49 illustrate some exemplary mounting structures for the electronic component 134.

Figure 39:
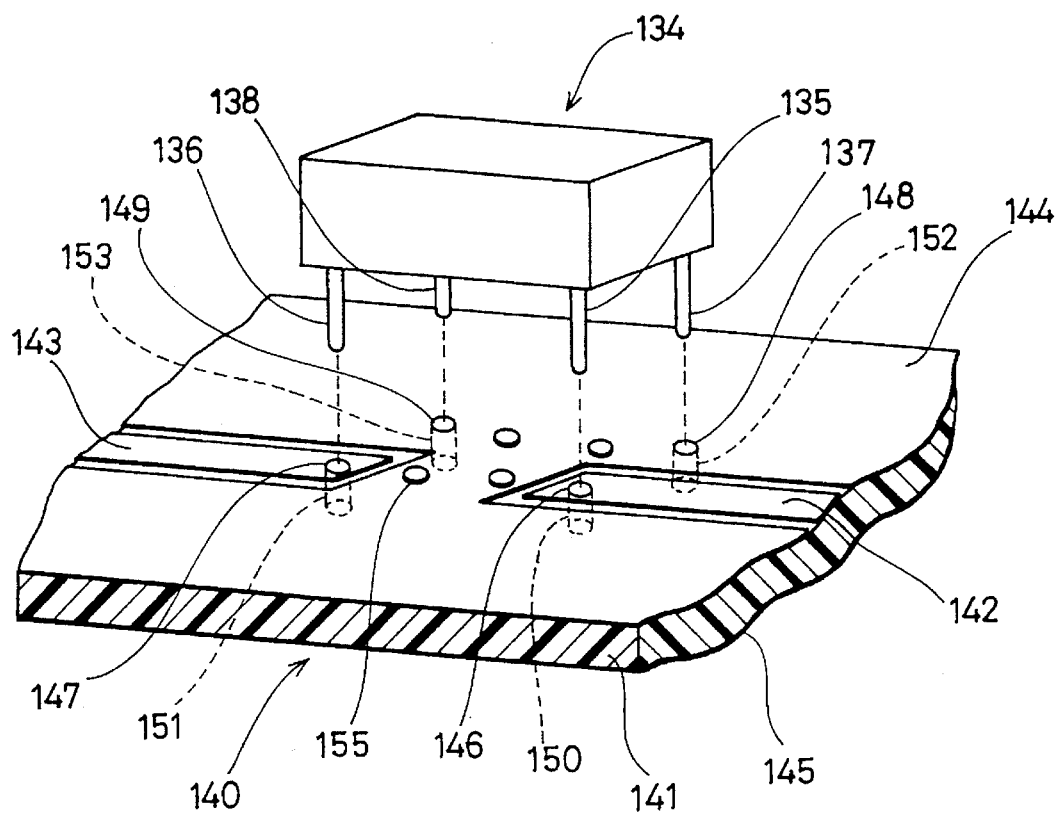
FIG. 39 is a perspective view showing a mounting structure for an electronic component according to a thirteenth embodiment of the present invention.
Figure 40:
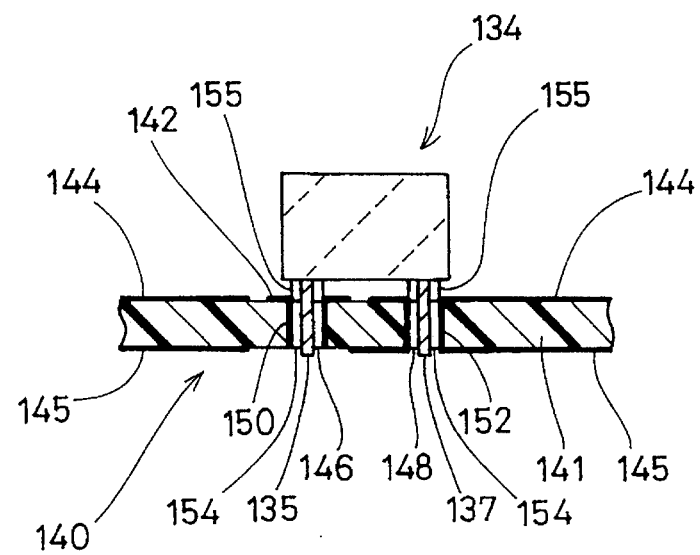
FIG. 40 is a sectional view of the mounting structure shown in FIG. 39.

Referring to FIGS. 39 and 40, a circuit board 140 comprises an electric insulating substrate 141. In a mode substantially similar to that of the circuit board 17 shown in FIG. 4, two transmission line members 142 and 143 and a first ground electrode 144 are formed on an upper major surface of the substrate 141. Further, a second ground electrode 145 is formed on a lower major surface of the substrate 141.

The circuit board 140 is further provided with through holes 146 to 149 for receiving the lead terminals 135 to 138 respectively. Through-hole electrodes 150 to 153 are formed on inner peripheral surfaces of the through holes 146 to 149 respectively. The through holes 146 and 147 are positioned in regions provided with the transmission line members 142 and 143 respectively, and the through-hole electrodes 150 and 151 are conductively connected with the transmission line members 142 and 143 respectively. These through-hole electrodes 150 and 151 are electrically insulated from the second ground electrode 145. The through holes 148 and 149 are positioned in a region provided with the first ground electrode 144, and the through-hole electrodes 152 and 153 are conductively connected with the first ground electrode 144. The through-hole electrodes 152 and 153 are also conductively connected with the second ground electrode 145.

In order to mount the electronic component 134 on the circuit board 140, the lead terminals 135 to 138 are inserted in the through holes 146 to 149 respectively. At this time, the lead terminals 135 to 138 are not in contact with the through-hole electrodes 150 to 153. Namely, the lead terminals 135 to 138 define small clearances 154 between the same and the through-hole electrodes 150 to 153 respectively. Further, the holding patches 139 are bonded to the first ground electrode 144 through solder members 155, thereby fixing the electronic component 134 to the circuit board 140.

In such a mounting structure, the lead terminals 135 to 138 are electromagnetically coupled with the through-hole electrodes 150 to 153 through the clearances 154 respectively. Consequently, the input/output-side lead terminals 135 and 136 are electromagnetically coupled with the transmission line members 142 and 143 respectively, while the ground-side lead terminals 137 and 138 are electromagnetically coupled with the ground electrodes 144 and 145 respectively.

Figure 41:
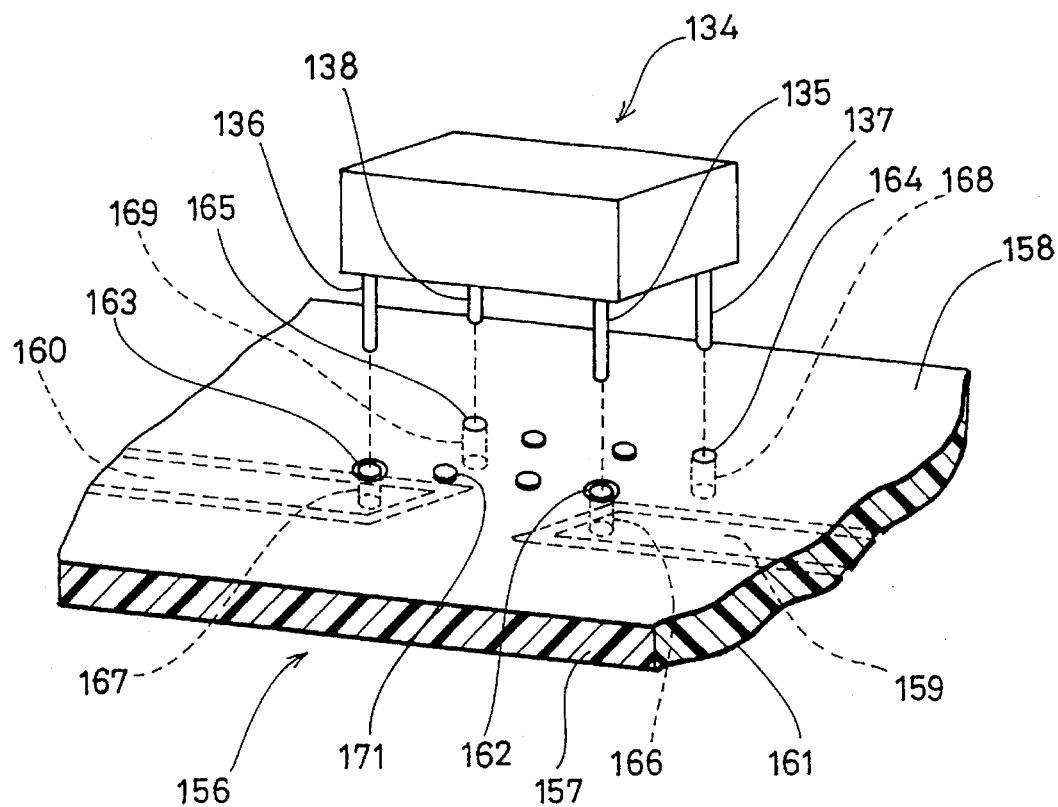
FIG. 41 is a perspective view showing a mounting structure for an electronic component according to a fourteenth embodiment of the present invention.
Figure 42:
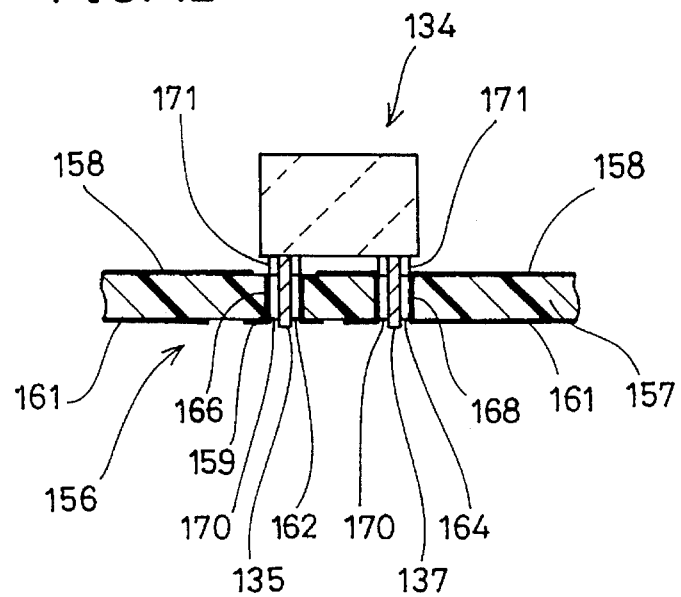
FIG. 42 is a sectional view of the mounting structure shown in FIG. 41.

Referring to FIGS. 41 and 42, a circuit board 156 is substantially similar in structure to the circuit board 140 shown in FIGS. 39 and 40, but employed in a vertically inverted state. This circuit board 156 comprises an electric insulating substrate 157. A first ground electrode 158 is formed substantially along the overall upper major surface of the substrate 157. On the other hand, two linear transmission line members 159 and 160 and a second ground electrode 161 are formed on a lower major surface of the substrate 157, to be insulated from each other.

The circuit board 156 is further provided with through holes 162 to 165 for receiving the lead terminals 135 to 138 respectively. Through-hole electrodes 166 to 169 are formed on inner peripheral surfaces of the through holes 162 to 165 respectively. The through holes 162 and 163 are positioned in regions provided with the transmission line members 159 and 160 respectively, and the through-hole electrodes 166 and 167 conductively connected with the transmission line members 159 and 160 respectively. These through-hole electrodes 166 and 167 are insulated from the first ground electrode 158. The through holes 164 and 165 are positioned in a region provided with the second ground electrode 161, and the through-hole electrodes 168 and 169 conductively connected with both of the first and second ground electrodes 158 and 161.

In order to mount the electronic component 134 on the circuit board 156, the lead terminals 135 to 138 are inserted in the through holes 162 to 165 respectively while defining small clearances 170 between the same and the through-hole electrodes 166 to 169. The holding patches 139 are bonded to the first ground electrode 158 by solder members 171, thereby fixing the electronic component 134 to the circuit board 156. In such a mounting structure, the lead terminals 135 to 138 are electromagnetically coupled with the transmission line members 159 and 160 and the ground electrodes 158 and 161 through the clearances 170 respectively.

Figure 43:
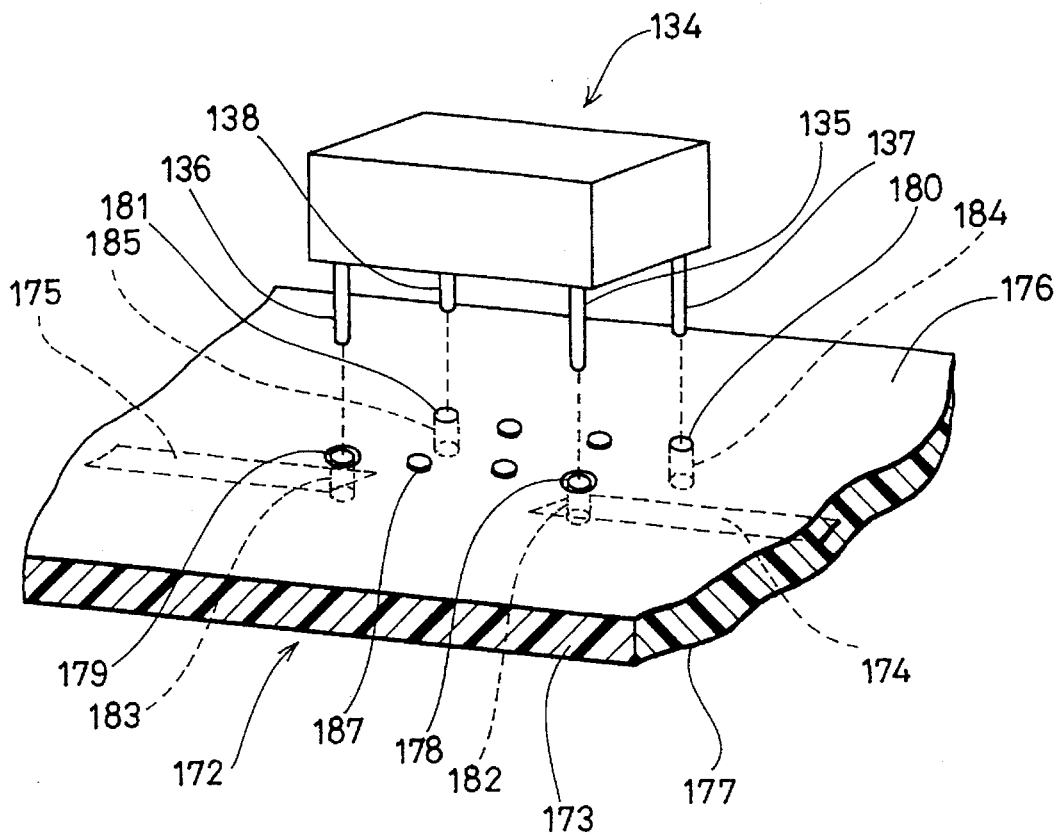
FIG. 43 is a perspective view showing a mounting structure for an electronic component according to a fifteenth embodiment of the present invention.
Figure 44:
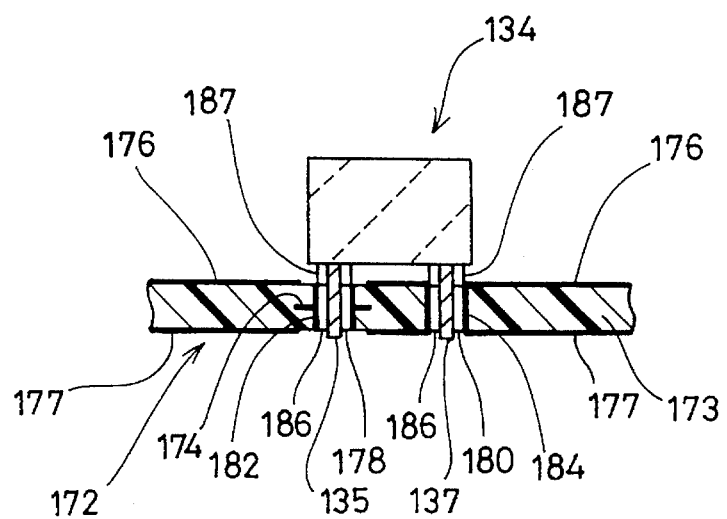
FIG. 44 is a sectional view of the mounting structure shown in FIG. 43.

Referring to FIGS. 43 and 44, a circuit board 172 comprises an electric insulating substrate 173 of a multilayer structure. Two linear transmission line members 174 and 175 are formed in the substrate 173 to be opposed to each other on a straight line. First and second ground electrodes 176 and 177 are formed substantially along the overall upper and major surfaces of the substrate 173 respectively.

The circuit board 172 is provided with through holes 178 to 181 for receiving the lead terminals 135 to 138 respectively. Through-hole electrodes 182 to 185 are formed on inner peripheral surfaces of the through holes 178 to 181 respectively. The through-hole electrodes 182 and 183 conductively connected with the transmission line members 174 and 175 respectively. The through-hole electrodes 182 and 183 conductively connected with neither of the first and second ground electrodes 176 and 177. On the other hand, the through-hole electrodes 184 and 185 conductively connected with both of the first and second ground electrodes 176 and 177.

In order to mount the electronic component 134 on the circuit board 172, the lead terminals 135 to 138 are inserted in the through holes 178 to 181 respectively while defining small clearances 186 between the same and the through holes 182 to 185. The holding patches 139 are bonded to the first ground electrode 176 by solder members 187, thereby fixing the electronic component 134 to the circuit board 172. In such a mounting structure, the lead terminals 138 to 138 are electromagnetically coupled with the transmission line members 174 and 175 and the ground electrodes 176 and 177 through the clearances 186 respectively.

Figure 45:
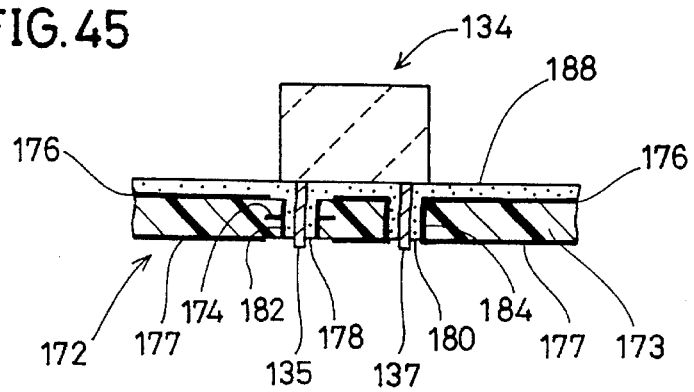
FIG. 45 is a sectional view showing a mounting structure for an electronic component according to a sixteenth embodiment of the present invention.

In the embodiments shown in FIGS. 39 and 40, 41 and 42, and 43 and 44 respectively, the clearances 154, 170 and 186 may be filled up with resin. For example, the clearances 186 of the embodiment shown in FIGS. 43 and 44 may be filled up with resin 188, as shown in FIG. 45. Referring to FIG. 45, the resin 188 extends onto the upper major surface of the circuit board 172. When the resin 188 has adhesiveness, it is possible to fix the electronic component 134 to the circuit board 172 without employing the aforementioned solder members 187. Referring to FIG. 45, elements corresponding to those shown in FIG. 44 are denoted by similar reference numerals, to omit redundant description.

According to the mounting structure shown in FIG. 45, the lead terminals 135 to 138 are electromagnetically coupled with the transmission line members 174 and 175 and the ground electrodes 176 and 177 through the resin 188 respectively.

Figure 46:
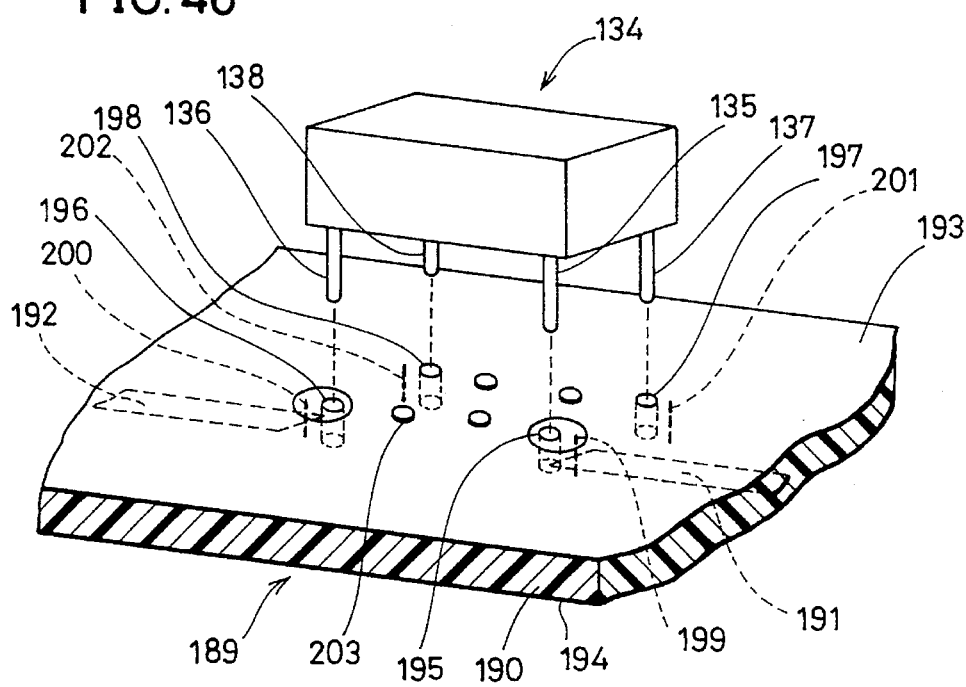
FIG. 46 is a perspective view showing a mounting structure for an electronic component according to a seventeenth embodiment of the present invention.
Figure 47:
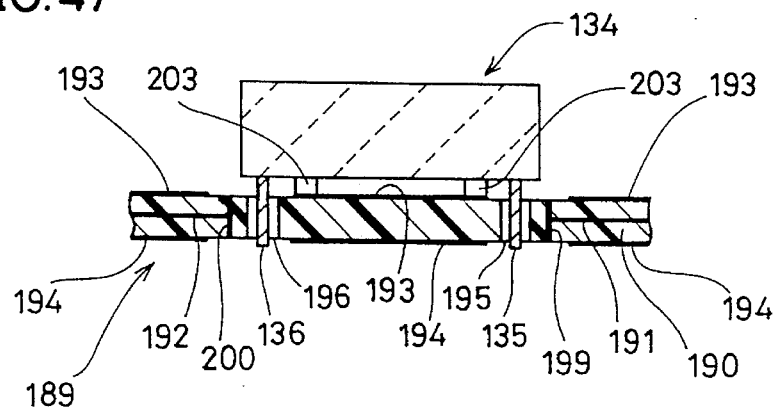
FIG. 47 is a sectional view of the mounting structure shown in FIG. 46.

Referring to FIGS. 46 and 47, a circuit board 189 comprises an electric insulating substrate 190 of a multilayer structure. Two linear transmission line members 191 and 192 are formed in the substrate 190 to be opposed to each other on a straight line. First and second ground electrodes 193 and 194 are formed substantially along overall upper and major surfaces of the substrate 190 respectively.

The circuit board 189 is provided with through holes 195 to 198 for receiving the lead terminals 135 to 138 respectively. The first and second ground electrodes 193 and 194 are formed not to reach opening edges of the through holes 195 and 196 respectively.

Conductive members 199 to 202, which are provided by conductive materials filling up cavities, are arranged in the vicinity of the through holes 195 to 198 respectively. The cavities which are filled up with the conductive materials for providing the conductive members 199 to 202 can be formed by a well-known technique of forming via holes. The conductive members 199 and 200 conductively connected with the transmission line members 191 and 192 respectively. The conductive members 199 and 200 conduct with neither of the ground electrodes 193 and 194. On the other hand, the conductive members 201 and 202 conductively connected with both of the ground electrodes 193 and 194.

In order to mount the electronic component 134 on the circuit board 189, the lead terminals 135 to 138 are inserted in the through holes 195 to 198 respectively. The holding patches 139 are bonded to the first ground electrode 193 by solder members 203, thereby fixing the electronic component 134 to the circuit board 189. While the lead terminals 135 and 136 shown in FIG. 47 are inserted in the through holes 195 and 196 respectively while defining clearances, the lead terminals 135 to 138 may alternatively be in contact with inner peripheral surfaces of the through holes 195 to 198 receiving the same.

In such a mounting structure for the electronic component 134, parts of the substrate 190 are interposed between the lead terminals 135 to 138 and the conductive members 199 to 202 respectively. Therefore, the lead terminals 135 to 138 are electromagnetically coupled with the transmission line members 191 and 192 and the ground electrodes 193 and 194 through the parts of the substrate 190 respectively.

Figure 48:
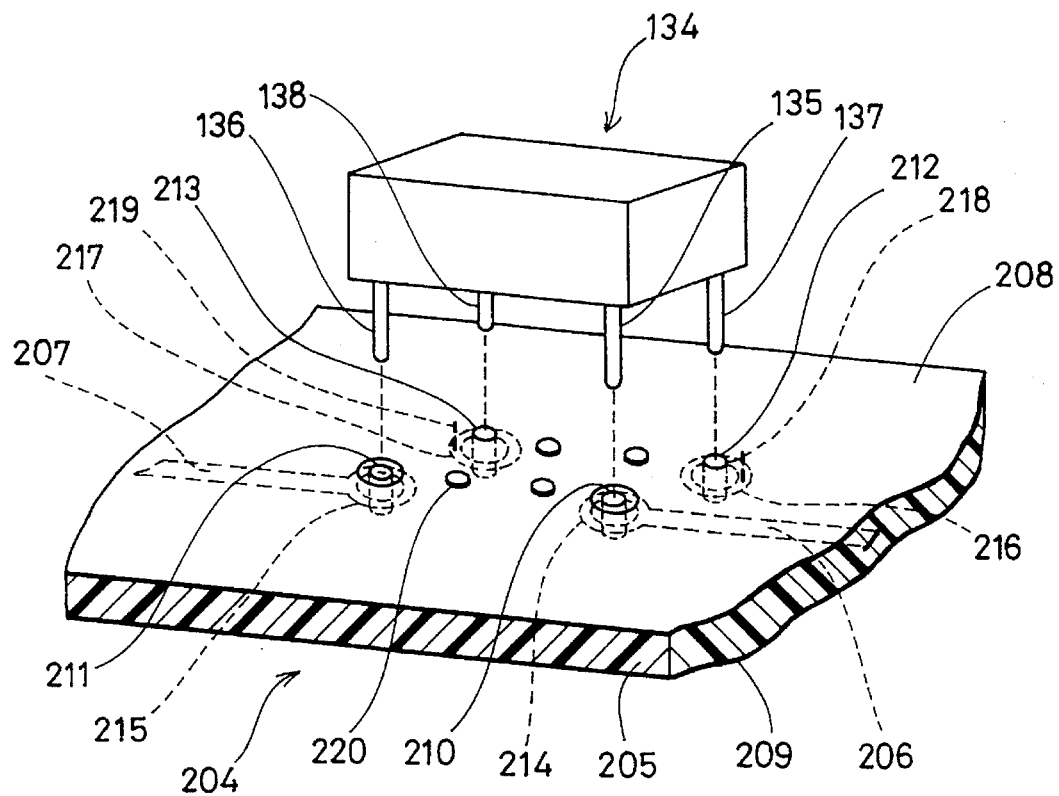
FIG. 48 is a perspective view showing a mounting structure for an electronic component according to an eighteenth embodiment of the present invention.
Figure 49:
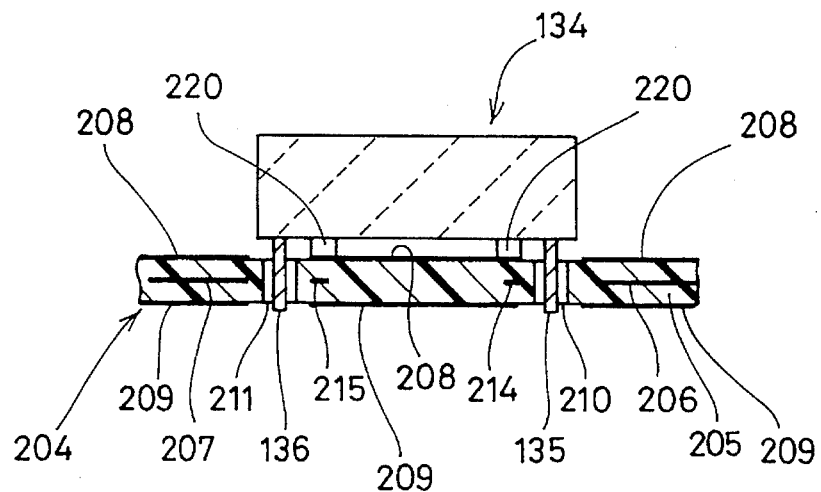
FIG. 49 is a sectional view of the mounting structure shown in FIG. 48.

Referring to FIGS. 48 and 49, a circuit board 204 comprises an electric insulating substrate 205 of a multilayer structure. Two linear transmission line members 206 and 207 are formed in the substrate 205 to be opposed to each other on a straight line. First and second ground electrodes 208 and 209 are formed substantially along overall upper and lower major surfaces of the substrate 205 respectively.

The circuit board 204 is provided with through holes 210 to 213 for receiving the lead terminals 135 to 138 respectively. Ring electrodes 214 to 217 are formed in the substrate 205 in the vicinity of the through holes 210 to 213 respectively. The ring electrodes 214 to 217, having inner diameters which are larger than the diameters of the through holes 210 to 213 respectively, are positioned to enclose the through holes 210 to 213. The ring electrodes 214 and 215 integrally extend from the transmission line members 206 and 207 respectively, and conductively connected with the transmission line members 206 and 207 respectively. On the other hand, the ring electrodes 216 and 217 conductively connected with the first ground electrode 208 through via holes 218 and 219 respectively.

In order to mount the electronic component 134 on the circuit board 204, the lead terminals 135 to 138 are inserted in the through holes 210 to 213 respectively. While the lead terminals 135 and 136 shown in FIG. 49 are inserted in the through holes 210 and 211 while defining clearances, the lead terminals 135 to 138 may alteratively be in contact with inner peripheral surfaces of the through holes 210 to 213 respectively. The holding patches 139 are bonded to the first ground electrode 208 through solder members 220, thereby fixing the electronic component 134 to the circuit board 204.

In such a mounting structure for the electronic component 134, parts of the substrate 205 are interposed between the lead terminals 135 to 138 and the ring electrodes 214 to 217 respectively. Therefore, the lead terminals 135 to 138 are electromagnetically coupled with the transmission line members 206 and 207 and the ground electrode 208 through the parts of the substrate 205 respectively.

While the present invention has been described with reference to the embodiments shown in the drawings, various modifications are available within the scope of the present invention, typical examples of which are now described.

It is possible to change the shapes and the structures of the external terminals provided on the electronic component and the transmission line members and the ground electrodes provided on the circuit board in various ways. In relation to the circuit board, for example, one of the ground electrodes provided on the upper and lower major surfaces may be omitted.

Further, the specific circuit board which is employed for providing the mounting structure according to each embodiment may be replaced by that employed in the mounting structure according to another embodiment, if possible. This also applies to replacement of the electronic component.

In addition, electromagnetic coupling between the external terminals of the electronic component and the transmission line members and the ground electrodes of the circuit board is attained by capacitance components which are provided by the small clearances, the resin, or parts of the substrate. It may be possible to adjust the frequency range of the transmission signals by adjusting the capacitance components. For example, it is possible to adjust the capacitance components by adjusting the clearances or changing the dielectric constant(s) or dimensions of the resin or the effective parts of the substrate. In the equivalent circuit shown in FIG. 6, for example, it is possible to reduce the cut-off frequency of the high-pass filter by increasing the capacitance component C1, C2 or C3, thereby reducing the lower limit of the frequencies of the signals as transmitted. This can be employed as means for attaining impedance matching with other circuit elements by adjusting the input impedance of the electronic component.

What is claimed is:

1. A mounting structure for mounting an electronic component, for being employed in the frequency range in the microwave band or above, on a circuit board;

said circuit board comprising a transmission line member, a ground electrode being electrically insulated from said transmission line member, and an electric insulating substrate having a major surface and holding said transmission line member and said ground electrode;

said electronic component comprising a plurality of external terminals;

said electronic component being fixed to said circuit board with said external terminals being capacitively coupled with said transmission line member and said ground electrode respectively; and said electronic component having opposite upper and lower surfaces and a plurality of side surfaces connecting said upper and lower surfaces with each other, said external terminals comprising external electrodes being formed on said side surfaces.

2. A mounting structure in accordance with claim 1, wherein said transmission line member and said ground electrode are formed on said major surface of said substrate, and said electronic component is fixed to said circuit board with said lower surface being directed to said transmission line member and said ground electrode and with small clearances being defined between said external electrodes and said transmission line member and said ground electrode, said external electrodes being capacitively coupled with said transmission line member and said ground electrode through said clearances respectively.

3. A mounting structure in accordance with claim 2, further comprising a member for bonding said lower surface of said electronic component with said ground electrode while defining a clearance therebetween.

4. A mounting structure in accordance with claim 3, wherein said bonding member includes solder.

5. A mounting structure in accordance with claim 3, wherein said bonding member includes a resin-based adhesive.

6. A mounting structure in accordance with claim 1, wherein said transmission line member and said ground electrode are formed on said major surface of said substrate, said circuit board further comprises a resin layer being formed to cover said transmission line member and said ground electrode, and said electronic component is fixed to said circuit board with said lower surface in contact with said resin layer, said external electrodes being capacitively coupled with said transmission line member and said ground electrode through said resin layer respectively.

7. A mounting structure in accordance with claim 6, wherein said resin layer bonds said electronic component to said circuit board.

8. A mounting structure in accordance with claim 1, wherein said transmission line member is formed within said substrate to extend in parallel with said major surface, said ground electrode is formed on said major surface of said substrate and has a coupling window comprised of a gap in said ground electrode in a position being opposed to said transmission line member, said external electrodes comprise an input/output external electrode and a ground external electrode, and said electronic component is fixed to said circuit board with said lower surface being directed to said ground electrode and with a small clearance being defined between said ground external electrode and said ground electrode and with said input/output external electrode being opposed to said transmission line member through said coupling window, said ground external electrode and said ground electrode being capacitively coupled with each other through said clearance, said input/output external electrode and said transmission line member being capacitively coupled with each other through said coupling window.

9. A mounting structure in accordance with claim 1, wherein a concave portion having a bottom surface and an inner side surface is formed in said major surface of said substrate, said electronic component being at least partially received in said concave portion with said lower surface being directed to said bottom surface of said concave portion, with said external electrodes being directed to said inner side surface of said concave portion, and with small clearances being defined between said external electrodes and said inner side surface of said concave portion.

10. A mounting structure in accordance with claim 9, wherein said transmission line member and said ground electrode are formed to be exposed on an edge defining an opening of said concave portion on said major surface of said substrate, said external electrodes being capacitively coupled with said transmission line member and said ground electrode through said clearances respectively.

11. A mounting structure in accordance with claim 9, wherein said ground electrode is formed to be exposed on an edge defining an opening of said concave portion on said major surface of said substrate and said transmission line member is formed in said substrate to be exposed on said inner side surface of said concave portion, said external electrodes being capacitively coupled with said transmission line member and said ground electrode through said clearances respectively.

12. A mounting structure for mounting an electronic component, for being employed in the frequency range in the microwave band or above, on a circuit board;

said circuit board comprising a transmission line member, a ground electrode being electrically insulated from said transmission line member, and an electric insulating substrate having a major surface and holding said transmission line member and said ground electrode;

said electronic component comprising a plurality of external terminals;

said electronic component being fixed to said circuit board with said external terminals being capacitively coupled with said transmission line member and said ground electrode respectively;

wherein said electronic component has opposite upper and lower surfaces, said external terminals comprising external electrodes being formed on said lower surface; and wherein said transmission line member and said ground electrode are formed on said major surface of said substrate and said electronic component is fixed to said circuit board with said lower surface being directed to said transmission line member and said ground electrode and with small clearances being defined between said external electrodes and said transmission line member and said ground electrode, said external electrodes being capacitively coupled with said transmission line member and said ground electrode through said clearances respectively.

13. A mounting structure in accordance with claim 12, further comprising a member for bonding said lower surface of said electronic component and said ground electrode with each other while defining a clearance therebetween.

14. A mounting structure in accordance with claim 13, wherein said bonding member includes solder.

15. A mounting structure in accordance with claim 13, wherein said bonding member includes a resin-based adhesive.

16. A mounting structure for mounting an electronic component, for being employed in the frequency range in the microwave band or above, on a circuit board;

said circuit board comprising a transmission line member, a ground electrode being electrically insulated from said transmission line member, and an electric insulating substrate having a major surface and holding said transmission line member and said ground electrode;

said electronic component comprising a plurality of external terminals;

said electronic component being fixed to said circuit board with said external terminals being capacitively coupled with said transmission line member and said ground electrode respectively;

wherein said electronic component has opposite upper and lower surfaces, said external terminals comprising external electrodes being formed on said lower surface; and wherein said transmission line member and said ground electrode are formed on said major surface of said substrate, said circuit board further comprises a resin layer being formed to cover said transmission line member and said ground electrode, and said electronic component is fixed to said circuit board with said lower surface being in contact with said resin layer, said external electrodes being capacitively coupled with said transmission line member and said ground electrode through said resin layer respectively.

17. A mounting structure in accordance with claim 16, wherein said resin layer bonds said electronic component to said circuit board.

18. A mounting structure for mounting an electronic component, for being employed in the frequency range in the microwave band or above, on a circuit board;

said circuit board comprising a transmission line member, a ground electrode being electrically insulated from said transmission line member, and an electric insulating substrate having a major surface and holding said transmission line member and said ground electrode;

said electronic component comprising a plurality of external terminals;

said electronic component being fixed to said circuit board with said external terminals being capacitively coupled with said transmission line member and said ground electrode respectively;

wherein said electronic component has opposite upper and lower surfaces, said external terminals comprising external electrodes being formed on said lower surface; and wherein said transmission line member is formed within said substrate to extend in parallel with said major surface, said ground electrode is formed on said major surface of said substrate and has a coupling window comprised of a gap in said ground electrode in a position being opposed to said transmission line member, said external electrodes comprise an input/output external electrode and a ground external electrode, and said electronic component is fixed to said circuit board with said lower surface being directed to said ground electrode and with a small clearance being defined between said ground external electrode and said ground electrode so that said input/output external electrode is opposed to said transmission line member through said coupling window, said ground external electrode and said ground electrode being capacitively coupled with each other through said clearance, said input/output external electrode and said transmission line member being capacitively coupled with each other through said coupling window.

19. A mounting structure for mounting an electronic component, for being employed in the frequency range in the microwave band or above, on a circuit board;

said circuit board comprising a transmission line member, a ground electrode being electrically insulated from said transmission line member, and an electric insulating substrate having a major surface and holding said transmission line member and said ground electrode;

said electronic component comprising a plurality of external terminals;

said electronic component being fixed to said circuit board with said external terminals being capacitively coupled with said transmission line member and said ground electrode respectively;

wherein said electronic component has opposite upper and lower surfaces, said external terminals comprising external electrodes being formed on said lower surface; and wherein said external electrodes include a slot line external electrode being opposed to said transmission line member.

20. A mounting structure for mounting an electronic component, for being employed in the frequency range in the microwave band or above, on a circuit board;

said circuit board comprising a transmission line member, a ground electrode being electrically insulated from said transmission line member, and an electric insulating substrate having a major surface and holding said transmission line member and said around electrode;

said electronic component comprising a plurality of external terminals;

said electronic component being fixed to said circuit board with said external terminals being capacitively coupled with said transmission line member and said ground electrode respectively;

wherein said electronic component has opposite upper and lower surfaces, said external terminals comprising external electrodes being formed on said lower surface; and wherein said transmission line member includes a slot line transmission line member.

21. A mounting structure for mounting an electronic component, for being employed in the frequency range in the microwave band or above, on a circuit board;

said circuit board comprising a transmission line member, a around electrode being electrically insulated from said transmission line member, and an electric insulating substrate having a major surface and holding said transmission line member and said ground electrode;

said electronic component comprising a plurality of external terminals;

said electronic component being fixed to said circuit board with said external terminals being capacitively coupled with said transmission line member and said ground electrode respectively; and wherein said external terminals comprise pin lead terminals, said circuit board having through holes for receiving said lead terminals respectively.

22. A mounting structure in accordance with claim 21, wherein through-hole electrodes are formed on inner peripheral surfaces of said through holes respectively, said through-hole electrodes comprising an electrode being electrically connected with said transmission line member and an electrode being electrically connected with said ground electrode, said lead terminals are inserted in said through holes with small clearances being defined between said lead terminals and said through-hole electrodes respectively, said lead terminals being capacitively coupled with said transmission line member and said ground electrode through said clearances respectively.

23. A mounting structure in accordance with claim 22, wherein said clearances are filled up with resin.

24. A mounting structure in accordance with claim 21, wherein conductive members are arranged in the vicinity of said through holes respectively, said conductive members comprising a conductive member being electrically connected with said transmission line member and a conductive member being electrically connected with said ground electrode, said lead terminals being capacitively coupled with said transmission line member and said ground electrode through portions of said substrate between said through holes and said conductive members respectively.

25. A mounting structure in accordance with claim 24, wherein said substrate has cavities in the vicinity of said through holes, said conductive members being provided by conductive materials filling up said cavities.

26. A mounting structure in accordance with claim 24, wherein said conductive members are provided by ring electrodes enclosing said through holes, said ring electrodes having inner diameters being larger than diameters of said through holes.

27. A mounting structure in accordance with claim 21, wherein said transmission line member and said ground electrode are formed on said major surface of said substrate.

28. A mounting structure in accordance with claim 21, wherein said transmission line member is formed within said substrate, said ground electrode being formed on said major surface of said substrate.

* * * * *